(12) United States Patent
Shim et al.

(10) Patent No.: US 12,277,004 B2
(45) Date of Patent: Apr. 15, 2025

(54) HINGE APPARATUS AND ELECTRONIC DEVICE INCLUDING THE SAME

(71) Applicant: SAMSUNG ELECTRONICS CO., LTD., Suwon-si (KR)

(72) Inventors: Heebo Shim, Suwon-si (KR); Hosang Nam, Suwon-si (KR); Kyunghoon Hyun, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 371 days.

(21) Appl. No.: 17/837,902

(22) Filed: Jun. 10, 2022

(65) Prior Publication Data
US 2022/0397936 A1    Dec. 15, 2022

Related U.S. Application Data

(63) Continuation of application No. PCT/KR2022/007643, filed on May 30, 2022.

(30) Foreign Application Priority Data

Jun. 11, 2021   (KR) .................. 10-2021-0076245

(51) Int. Cl.
*G06F 1/16*   (2006.01)
*G09F 9/30*   (2006.01)
(Continued)

(52) U.S. Cl.
CPC .......... *G06F 1/1616* (2013.01); *G06F 1/1652* (2013.01); *G06F 1/1681* (2013.01);
(Continued)

(58) Field of Classification Search
CPC .... G06F 1/1616; G06F 1/1652; G06F 1/1681; G06F 1/1643; G06F 1/1647;
(Continued)

(56) References Cited

U.S. PATENT DOCUMENTS 9,823,696 B2 * 11/2017 Vänskä ............... H04M 1/0202
10,067,536 B1    9/2018 Watamura
(Continued)

FOREIGN PATENT DOCUMENTS

KR    10-2008-0093340 A    10/2008
KR    10-2015-0096827       8/2015
(Continued)

OTHER PUBLICATIONS

Korean Office Action issued Aug. 21, 2023 in corresponding Korean Patent Application No. 10-2021-0076245.
(Continued)

*Primary Examiner* — Anthony M Haughton
*Assistant Examiner* — Theron S Milliser
(74) *Attorney, Agent, or Firm* — Nixon & Vanderhye P.C.

(57) ABSTRACT

An electronic device may include: a housing including a first housing and a second housing, a hinge connecting the first housing and the second housing to be rotatable, a display module including a display panel including a first area disposed in the first housing, a second area disposed in the second housing, and a folding area disposed in the hinge part, a first plate supporting the first area of the display panel, and a second plate supporting the second area of the display panel, a third plate disposed under the first plate, and a fourth plate disposed under the second plate. At least a part of at least one of the third plate and the fourth plate may be disposed between the first plate and the second plate to support at least some of the folding area of the display panel.

20 Claims, 18 Drawing Sheets

(51) Int. Cl.
    *H04M 1/02*     (2006.01)
    *H05K 5/00*     (2006.01)
    *H05K 5/02*     (2006.01)

(52) U.S. Cl.
    CPC .......... *G09F 9/301* (2013.01); *H04M 1/0268* (2013.01); *H05K 5/0086* (2013.01); *H05K 5/0226* (2013.01)

(58) Field of Classification Search
    CPC .... G06F 1/1658; G09F 9/301; H04M 1/0268; H04M 1/022; H05K 5/0086; H05K 5/0226
    See application file for complete search history.

(56) References Cited

U.S. PATENT DOCUMENTS

| | | | |
|---|---|---|---|
| 10,365,694 | B2 | 7/2019 | Lin et al. |
| 10,368,452 | B2 | 7/2019 | Yun et al. |
| 10,431,129 | B2 | 10/2019 | Wakata |
| 10,495,941 | B2 * | 12/2019 | Hashimoto ......... G02F 1/16753 |
| 10,620,668 | B2 * | 4/2020 | Park ........................ G09F 9/301 |
| 10,831,234 | B1 * | 11/2020 | Watamura ............. G06F 1/1652 |
| 10,863,635 | B2 * | 12/2020 | Watamura ............. G06F 1/1626 |
| 10,963,020 | B2 * | 3/2021 | Kim ........................ H04M 1/022 |
| 11,037,471 | B2 | 6/2021 | Choi |
| 11,132,027 | B2 | 9/2021 | Park et al. |
| 11,153,421 | B2 * | 10/2021 | Kang ....................... H05K 1/189 |
| 11,221,648 | B2 * | 1/2022 | Myeong ................ G06F 1/1681 |
| 11,301,007 | B2 * | 4/2022 | Kinoshita ............. G06F 1/1681 |
| 11,337,321 | B2 * | 5/2022 | Jia ........................ H05K 5/0226 |
| 11,379,002 | B2 * | 7/2022 | Kinoshita ............. G06F 1/1681 |
| 11,455,004 | B2 * | 9/2022 | Kinoshita ............. G06F 1/1681 |
| 11,481,004 | B2 * | 10/2022 | Shin ....................... G06F 1/1643 |
| 11,579,654 | B2 * | 2/2023 | Mizoguchi ........... G06F 1/1641 |
| 11,889,008 | B2 * | 1/2024 | Kang ....................... H05K 1/189 |
| 11,947,397 | B2 * | 4/2024 | Shin ....................... G06F 1/1641 |
| 11,956,378 | B2 * | 4/2024 | Kang ..................... H04M 1/022 |
| 2008/0253073 | A1 | 10/2008 | Kee et al. |
| 2013/0286553 | A1 * | 10/2013 | Vanska ............... H04M 1/0202 |
| | | | 361/679.01 |
| 2015/0233162 | A1 | 8/2015 | Lee et al. |
| 2018/0059720 | A1 * | 3/2018 | Sun ........................ G06F 1/1618 |
| 2018/0335679 | A1 * | 11/2018 | Hashimoto ......... G02F 1/13338 |
| 2019/0005857 | A1 * | 1/2019 | Wakata .................. H10K 59/00 |
| 2019/0346887 | A1 * | 11/2019 | Park ....................... G06F 1/1652 |
| 2020/0073441 | A1 * | 3/2020 | Shin .................... H10K 59/8792 |
| 2020/0089273 | A1 * | 3/2020 | Watamura ............. G06F 1/1626 |
| 2020/0267244 | A1 | 8/2020 | Kim et al. |
| 2020/0267859 | A1 | 8/2020 | Kim et al. |
| 2020/0275563 | A1 * | 8/2020 | Watamura ................. E05D 3/14 |
| 2020/0319672 | A1 | 10/2020 | Kim et al. |
| 2020/0351393 | A1 * | 11/2020 | Kang .................... H04M 1/022 |
| 2021/0026406 | A1 | 1/2021 | Kim et al. |
| 2021/0034106 | A1 | 2/2021 | Jung |
| 2021/0072790 | A1 * | 3/2021 | Myeong ............. H10K 59/8731 |
| 2021/0124397 | A1 * | 4/2021 | Mizoguchi ........... G06F 1/1681 |
| 2021/0168953 | A1 | 6/2021 | Lee |
| 2021/0365066 | A1 * | 11/2021 | Kinoshita ............. G06F 1/1679 |
| 2021/0365072 | A1 * | 11/2021 | Kinoshita ............. G06F 1/1616 |
| 2022/0038563 | A1 * | 2/2022 | Kang ................... H04M 1/0216 |
| 2022/0057837 | A1 * | 2/2022 | Shin ...................... G06F 1/1641 |
| 2022/0121239 | A1 * | 4/2022 | Kinoshita ............. G06F 1/1681 |
| 2022/0159109 | A1 * | 5/2022 | Kang .................... G06F 1/1681 |
| 2023/0073792 | A1 * | 3/2023 | Shin ....................... G06F 1/1652 |
| 2024/0129388 | A1 * | 4/2024 | Kang ..................... H04M 1/022 |

FOREIGN PATENT DOCUMENTS

| | | |
|---|---|---|
| KR | 10-2018-0079016 | 7/2018 |
| KR | 10-2019-0116592 | 10/2019 |
| KR | 10-2020-0064376 | 6/2020 |
| KR | 10-2020-0068140 | 6/2020 |
| KR | 10-2021-0014823 | 2/2021 |
| KR | 10-2021-0067292 A | 6/2021 |

OTHER PUBLICATIONS

Search Report and Written Opinion dated Aug. 23, 2022 issued in International Patent Application No. PCT/KR2022/007643.

* cited by examiner

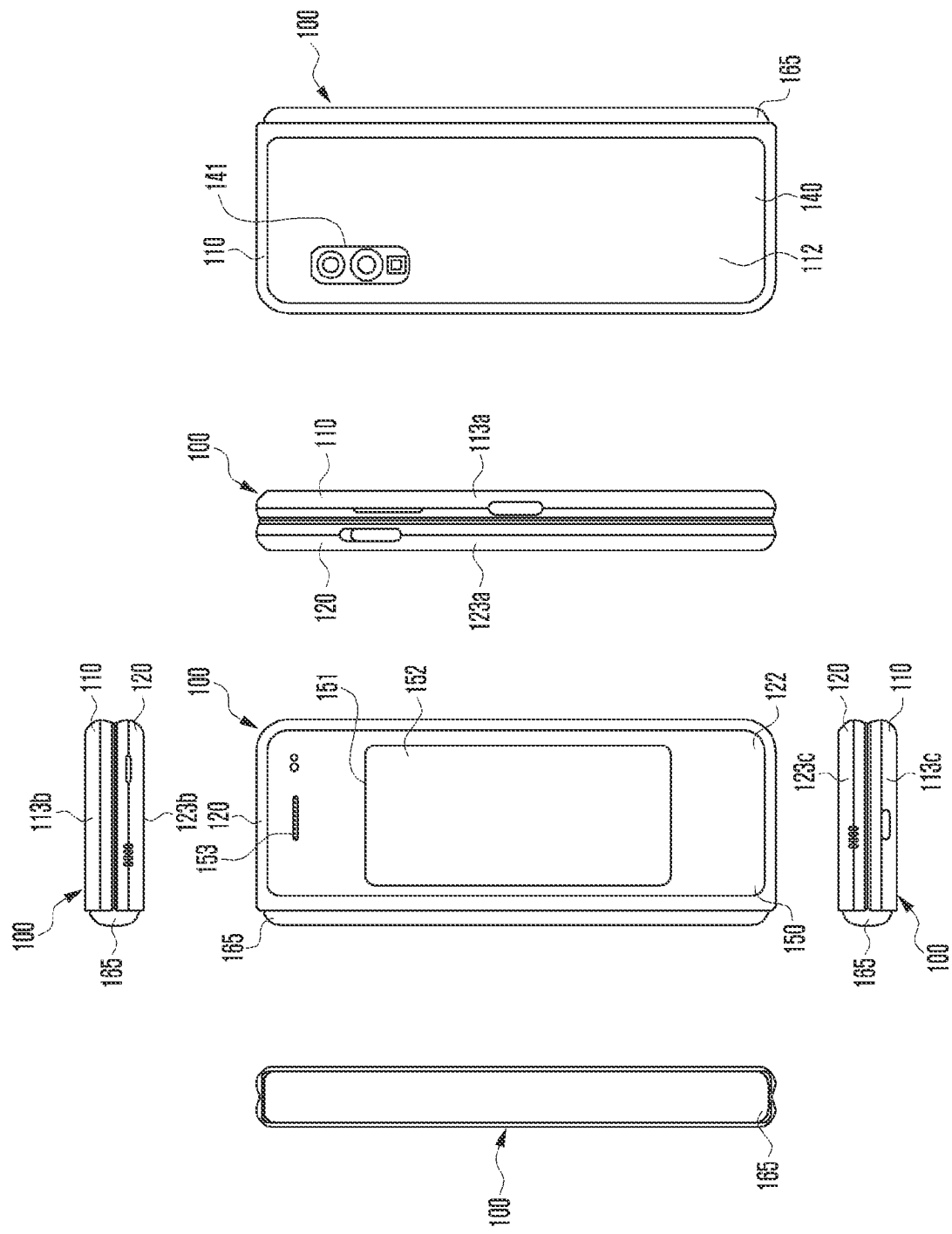

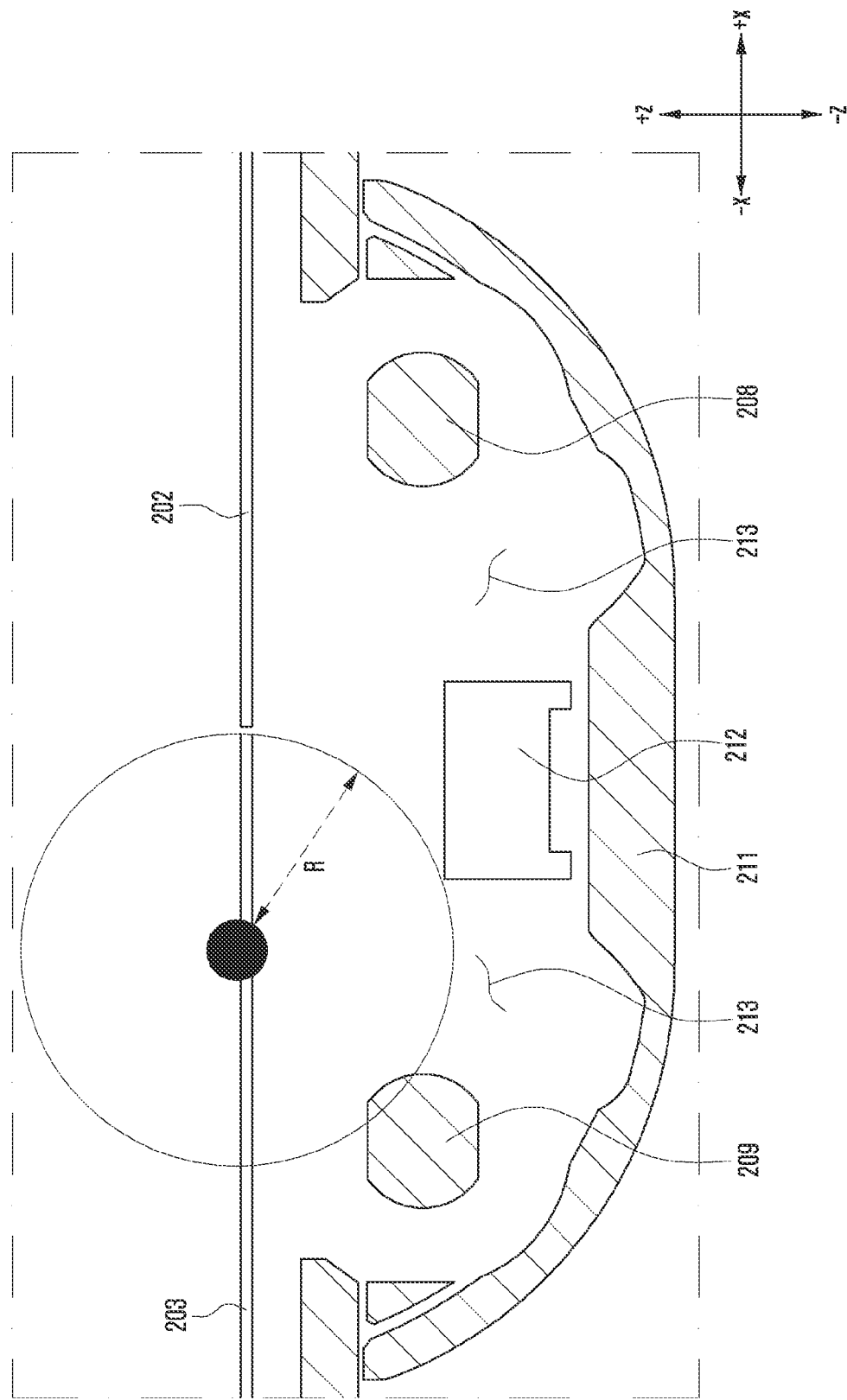

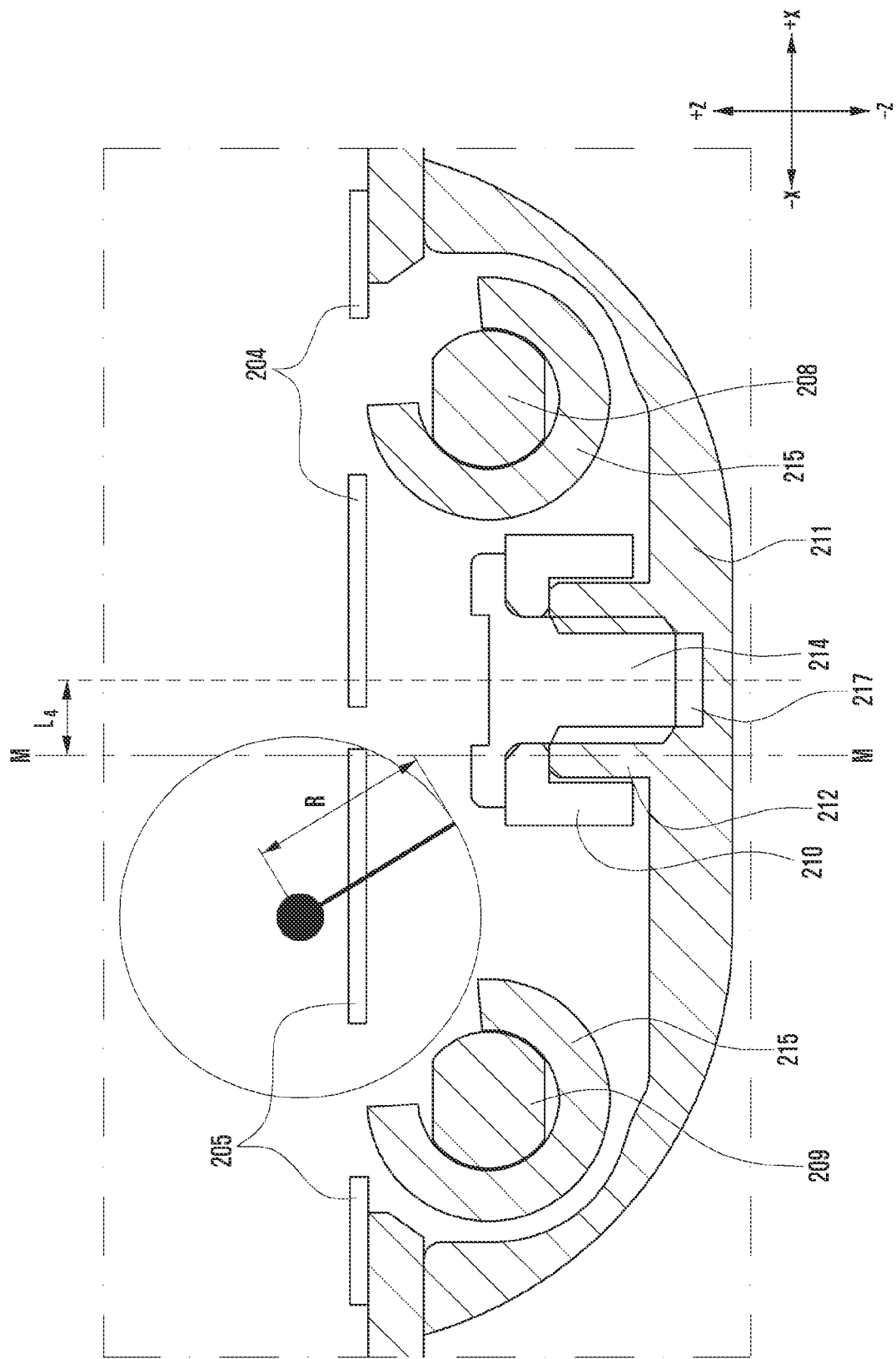

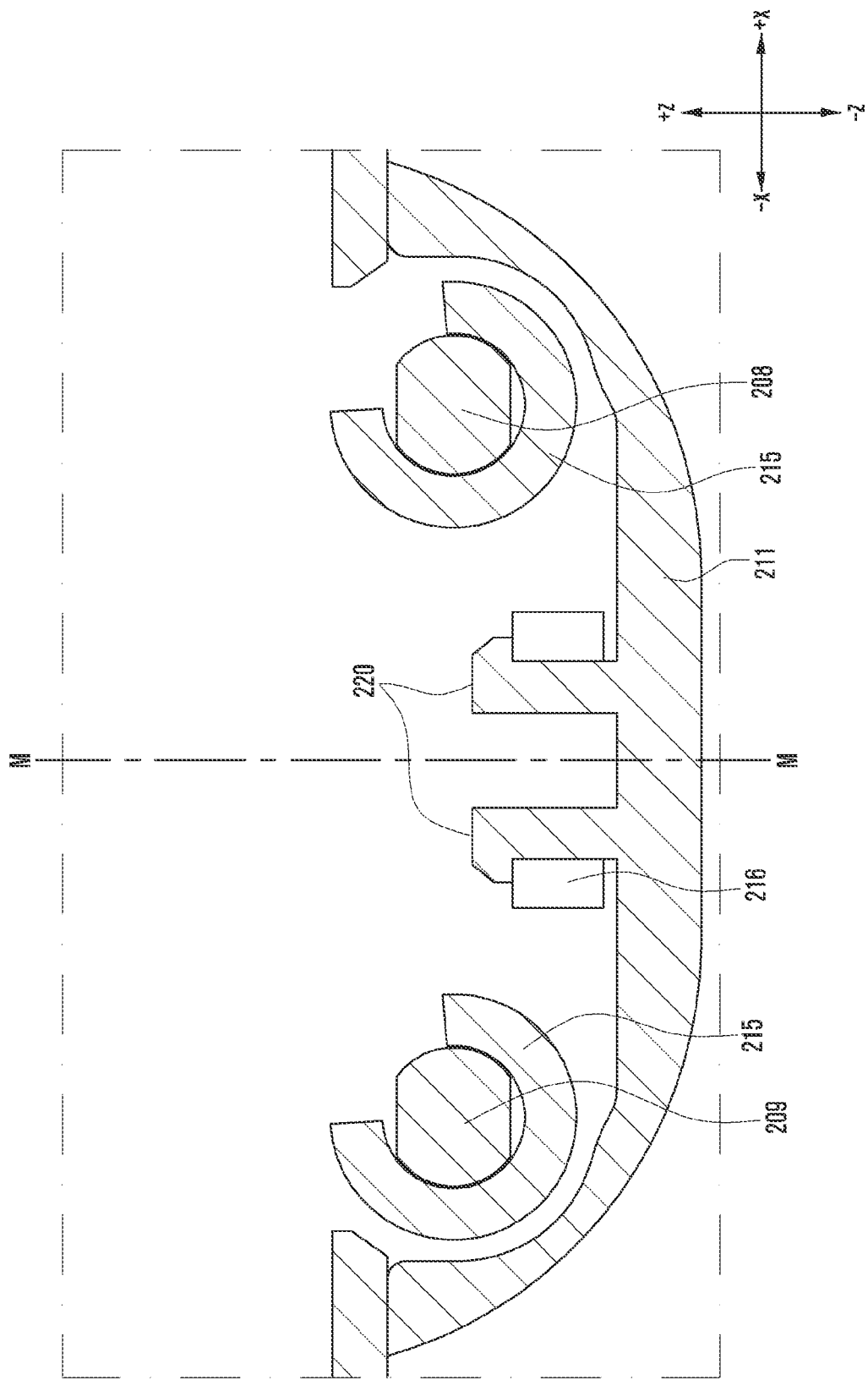

HINGE APPARATUS AND ELECTRONIC DEVICE INCLUDING THE SAME

CROSS-REFERENCE TO RELATED APPLICATIONS

This application is a continuation of International Application No. PCT/KR2022/007643 designating the United States, filed on May 30, 2022, in the Korean Intellectual Property Receiving Office and claiming priority to Korean Patent Application No. 10-2021-0076245, filed on Jun. 11, 2021, in the Korean Intellectual Property Office, the disclosures of which are incorporated by reference herein in their entireties.

BACKGROUND

Field

The disclosure relates to a hinge apparatus and an electronic device including the same.

Description of Related Art

As technology for an electronic device continues to develop, the display size of the electronic device is increased so that a user can use various functions, such as a multimedia function and web surfing, in a larger screen. Accordingly, the size of the electronic device also continues to increase, and various types of electronic devices may be provided in order to improve the portability of the electronic device. For example, there may be provided a foldable electronic device folded so that housings of the electronic device are symmetrical to each other on the basis of a rotation axis within the electronic device.

As the foldable electronic device emerges, the development of a technology for components that connect the housings of the electronic device in a way to be foldable is increased.

A foldable display may be disposed in a foldable electronic device. In order for the foldable electronic device to be smoothly folded, a housing in which components of the electronic device are disposed and internal instruments may be separated on the basis of a folding area. Accordingly, the folding area of a display may be vulnerable to an external force.

SUMMARY

Embodiments of the disclosure may provide an apparatus capable of protecting the folding area of the display.

According to various example embodiments, an electronic device may include: a housing including a first housing and a second housing, a hinge connecting the first housing and the second housing to be rotatable, a display module including a display panel including a first area disposed in the first housing, a second area disposed in the second housing, and a folding area disposed in hinge portion, a first plate supporting the first area of the display panel, and a second plate supporting the second area of the display panel, a third plate disposed under the first plate, and a fourth plate disposed under the second plate. At least a part of at least one of the third plate and the fourth plate may be disposed between the first plate and the second plate to support at least some of the folding area of the display panel.

According to various example embodiments, a hinge apparatus may include: a hinge connecting a first housing and second housing of an electronic device to be rotatable, a third plate disposed under a first plate supporting a first area of a display panel of the electronic device and combined with the hinge, and a fourth plate disposed under a second plate supporting a second area of the display panel of the electronic device and combined with the hinge. At least a part of at least one of the third plate and the fourth plate may be disposed between the first plate and the second plate, and may be configured to support a folding area of the display panel.

According to various example embodiments of the disclosure, a structure supporting the folding area of a display can be provided. Accordingly, the folding area of the display can be protected.

BRIEF DESCRIPTION OF THE DRAWINGS

In relation to the description of the drawings, the same or similar reference numerals may be used with respect to the same or similar elements. Further, the above and other aspects, features and advantages of certain embodiments of the present disclosure will be more apparent from the following detailed description, taken in conjunction with the accompanying drawings, in which:

FIG. 1B is a diagram illustrating a folded state of the electronic device in FIG. 1A according to various embodiments;

FIG. 5 is a cutaway cross-sectional view illustrating the first plate, the second plate, the hinge, and the hinge cover along line A-A in FIG. 4C according to various embodiments;

FIG. 6 is a cutaway cross-sectional view illustrating the third plate, the fourth plate, the hinge, and the hinge cover along line B-B in FIG. 4C according to various embodiments;

FIG. 7B is a cutaway cross-sectional view illustrating an example hinge and a hinge cover along line C-C in FIG. 7A according to various embodiments.

DETAILED DESCRIPTION

Figure 1A:
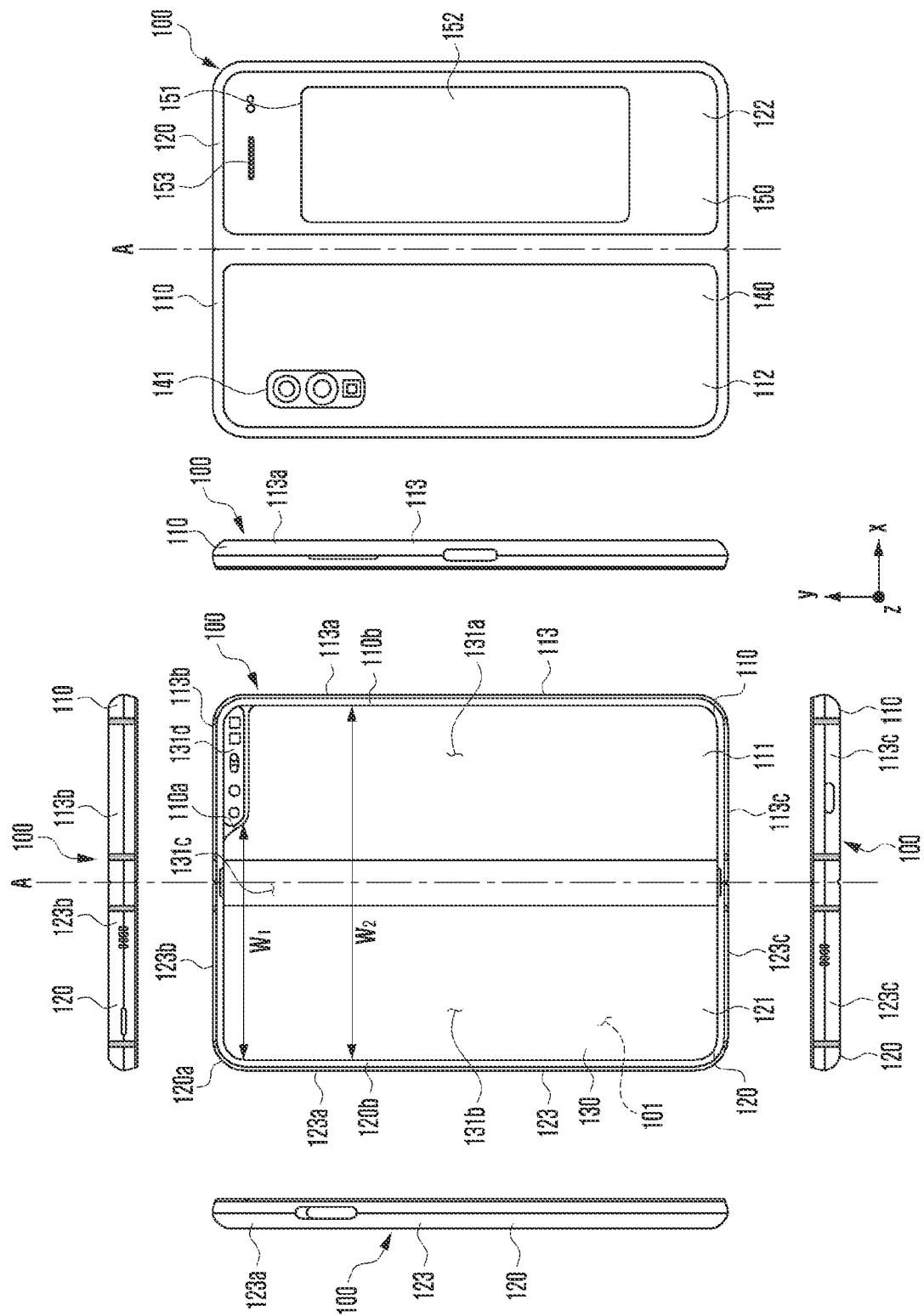
FIG. 1A is a diagram illustrating an unfolded state of an electronic device according to various embodiments.

It should be appreciated that various example embodiments of the disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

FIG. 1A is a diagram illustrating an unfolded state of an electronic device 100 according to various embodiments. FIG. 1B is a diagram illustrating a folded state of the electronic device 100 in FIG. 1A according to various embodiments.

Referring to FIG. 1A, an electronic device 100 may include a pair of housing 110 and 120 rotatably coupled via a hinge structure (e.g., hinge structure 164 in FIG. 1C) to be folded relative to each other, a hinge cover 165 covering the foldable portion of the pair of housings 110 and 120, and a display 130 (e.g., flexible display or foldable display) disposed in the space formed by the pair of housings 110 and 120. In the description, the surface on which the display 130 is disposed may be referred to as the front surface of the electronic device 100, and the opposite side of the front surface may be referred to as the rear surface of the electronic device 100. The surface surrounding the space between the front surface and the rear surface may be referred to as the side surface of the electronic device 100.

In the disclosure, a direction to which the front surface is directed may be defined as a first direction, and a direction to which the rear surface is directed may be defined as a second direction.

In the disclosure, in describing a stack order (e.g., the stack order of the display), "a layer B is formed on a layer" may refer, for example, to the layer B being formed in the first direction from a layer A. In describing a stack order (e.g., the stack order of the display), "a layer B is formed below a layer" may refer, for example, to the layer B being formed in the second direction from a layer A.

In an embodiment, the pair of housings 110 and 120 may include a first housing 110 including a sensor region 131*d*, a second housing 120, a first rear cover 140, and a second rear cover 150. The pair of housings 110 and 120 of the electronic device 100 are not limited to the shape or combination illustrated in FIGS. 1A and 1B, but may be implemented in various shapes or combinations. For example, in an embodiment, the first housing 110 and the first rear cover 140 may be formed as a single body, and the second housing 120 and the second rear cover 150 may be formed as a single body.

In an embodiment, the first housing 110 and the second housing 120 may be disposed at both sides with respect to the folding axis (A) and may be substantially symmetrical with respect to the folding axis (A). In an embodiment, the angle or distance between the first housing 110 and the second housing 120 may vary depending upon whether the electronic device 100 is in the flat state or closed state, the folded state, or the intermediate state. In an embodiment, the first housing 110 includes the sensor region 131*d* where various sensors are disposed, but may have a symmetrical shape with the second housing 120 in other regions. In an embodiment, the sensor region 131*d* may be disposed in a specific region of the second housing 120 or may be replaced.

Figure 1C:
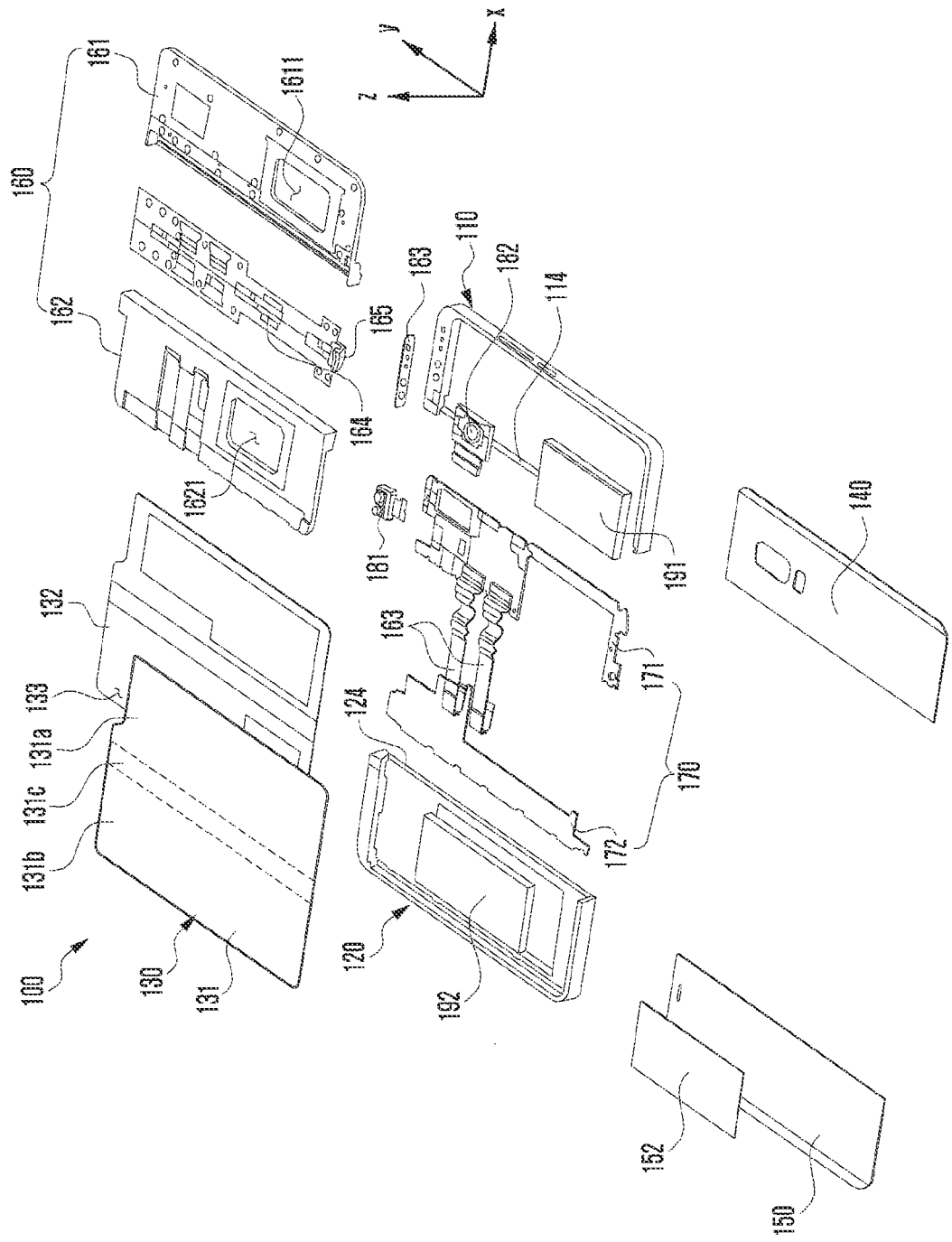
FIG. 1C is an exploded perspective view of the electronic device according to various embodiments.

In an embodiment, the electronic device 100 may operate in an in-folding manner and/or in an out-folding manner in a way that the first housing 110 is rotated in a range of 0 to 360 degrees with respect to the second housing 120 through a hinge (e.g., the hinge 164 in FIG. 1C). According to various embodiments, the hinge 164 may be vertically formed or may be horizontally formed when the electronic device 100 is viewed from the top. According to various embodiments, the hinge 164 may be plural. For example all the plurality of hinges may be arranged in the same direction. Furthermore, for example, some of the plurality of hinges may be arranged and folded in different directions.

In an embodiment, during the flat state of the electronic device 100, the first housing 110 may be connected to the hinge structure (e.g., hinge structure 164 in FIG. 1C), and may include a first surface 111 facing the front surface of the electronic device 100, a second surface 112 facing away from the first surface 111, and a first side member 113 enclosing at least a portion of the space between the first surface 111 and the second surface 112. In an embodiment, the first side member 113 may include a first side surface 113*a* disposed in parallel with the folding axis (A), a second side surface 113*b* extending from one end of the first side surface 113*a* in a direction perpendicular to the folding axis, and a third side surface 113*c* extending from the other end of the first side surface 113*a* in a direction perpendicular to the folding axis.

In an embodiment, during the flat state of the electronic device 100, the second housing 120 may be connected to the hinge structure (e.g., hinge structure 164 in FIG. 1C), and may include a third surface 121 facing the front surface of the electronic device 100, a fourth surface 122 facing away from the third surface 121, and a second side member 123 enclosing at least a portion of the space between the third surface 121 and the fourth surface 122. In an embodiment, the second side member 123 may include a fourth side surface 123a disposed in parallel with the folding axis (A), a fifth side surface 123b extending from one end of the fourth side surface 123a in a direction perpendicular to the folding axis, and a sixth side surface 123c extending from the other end of the fourth side surface 123a in a direction perpendicular to the folding axis. In an embodiment, the third surface 121 may face the first surface 111 in the folded state.

In an embodiment, the electronic device 100 may include a recess 101 formed to accommodate the display 130 through a structural combination of the shapes of the first housing 110 and the second housing 120. The recess 101 may have substantially the same size as the display 130. In an embodiment, the recess 101 may have two or more different widths in a direction perpendicular to the folding axis (A) due to the sensor region 131d. For example, the recess 101 may have a first width (W1) between a first portion 120a of the second housing 120 parallel to the folding axis (A) and a first portion 110a of the first housing 110 formed at the edge of the sensor region 131d, and have a second width (W2) between a second portion 120b of the second housing 120 and a second portion 110b of the first housing 110 that does not correspond to the sensor region 113d and is parallel to the folding axis (A). Here, the second width (W2) may be wider than the first width (W1). In other words, the recess 101 may be formed to have the first width (W1) ranging from the first portion 110a of the first housing 110 to the first portion 120a of the second housing 120 (asymmetric shape), and the second width (W2) ranging from the second portion 110b of the first housing 110 to the second portion 120b of the second housing 120 (symmetric shape). In an embodiment, the first portion 110a and the second portion 110b of the first housing 110 may be located at different distances from the folding axis (A). The width of the recess 101 is not limited to the example shown above. In various embodiments, the recess 101 may have two or more different widths owing to the shape of the sensor region 113d or the asymmetry of the first housing 110 or the second housing 120.

In an embodiment, at least a portion of the first housing 110 and the second housing 120 may be made of a metal or non-metal material having a rigidity value selected to support the display 130.

In an embodiment, the sensor region 131d may be formed to have a preset area near to one corner of the first housing 110. However, the arrangement, shape, or size of the sensor region 131d is not limited to the illustrated example. For example, in a certain embodiment, the sensor region 131d may be formed at another corner of the first housing 110 or in any region between the upper corner and the lower corner. In an embodiment, the sensor region 131d may be disposed at a portion of the second housing 120. In an embodiment, the sensor region 131d may be formed to extend between the first housing 110 and the second housing 120. In an embodiment, to perform various functions, the electronic device 100 may include components exposed to the front surface of the electronic device 100 through the sensor region 113d or through one or more openings provided in the sensor region 131d. The components may include, for example, at least one of a front camera, a receiver, a proximity sensor, an illuminance sensor, an iris recognition sensor, an ultrasonic sensor, or an indicator.

In an embodiment, the first rear cover 140 may be disposed on the second surface 112 of the first housing 110 and may have a substantially rectangular periphery. In an embodiment, at least a portion of the periphery may be wrapped by the first housing 110. Similarly, the second rear cover 150 may be disposed on the fourth surface 122 of the second housing 120, and at least a portion of the periphery thereof may be wrapped by the second housing 120.

In the illustrated embodiment, the first rear cover 140 and the second rear cover 150 may have a substantially symmetrical shape with respect to the folding axis (A). In an embodiment, the first rear cover 140 and the second rear cover 150 may have various different shapes. In an embodiment, the first rear cover 140 may be formed as a single body with the first housing 110, and the second rear cover 150 may be formed as a single body with the second housing 120.

In an embodiment, the first rear cover 140, the second rear cover 150, the first housing 110, and the second housing 120 may be combined with each other so as to provide a space where various components (e.g., printed circuit board, antenna module, sensor module, and battery) of the electronic device 100 can be arranged. In an embodiment, one or more components may be disposed on or visually exposed via the rear surface of the electronic device 100. For example, one or more components or sensors may be visually exposed through the first rear region 141 of the first rear cover 140. The sensors may include a proximity sensor, a rear camera, and/or a flash. In an embodiment, at least a portion of the sub-display 152 may be visually exposed through the second rear region 151 of the second rear cover 150.

The display 130 may be disposed on the space formed by the pair of housings 110 and 120. For example, the display 130 may be seated in the recess (e.g., recess 101 in FIG. 1A) formed by the pair of housings 110 and 120, and may be disposed to substantially occupy most of the front surface of the electronic device 100. Hence, the front surface of the electronic device 100 may include the display 130, a portion (e.g., edge region) of the first housing 110 close to the display 130, and a portion (e.g. edge region) of the second housing 120 close to the display 130. In an embodiment, the rear surface of the electronic device 100 may include the first rear cover 140, a portion (e.g., edge region) of the first housing 110 close to the first rear cover 140, the second rear cover 150, and a portion (e.g. edge region) of the second housing 120 close to the second rear cover 150.

In an embodiment, the display 130 may refer to a display in which at least a portion may be deformed into a flat or curved surface. In an embodiment, the display 130 may include a folding region 131c, a first region 131a disposed on one side (e.g., right side of the folding region 131c) with respect to the folding region 131c, and a second region 131b disposed on the other side (e.g., left side of the folding region 131c). For example, the first region 131a may be disposed on the first surface 111 of the first housing 110, and the second region 131b may be disposed on the third surface 121 of the second housing 120. This demarcation of the display 130 is only an example, and the display 130 may be subdivided into plural regions (e.g., four or more regions) according to the structure or functionality. For example, in the embodiment of FIG. 1A, the area of the display 130 may be subdivided with respect to the folding region 131c or the folding axis (A) extending parallel to the y-axis. However, in an embodiment, the area of the display 130 may be subdivided with respect to a different folding region (e.g., folding region parallel to the x-axis) or a different folding axis (e.g., folding axis parallel to the x-axis). The aforementioned subdivision of the display is only a physical demarcation based on the pair of housings 110 and 120 and the hinge structure (e.g., hinge structure 164 in FIG. 1C), and the display 130 may substantially present one full screen through the pair of housings 110 and 120 and the hinge structure (e.g., hinge structure 164 in FIG. 1C). In an embodiment, the first region 131a and the second region 131b may have a symmetrical shape with respect to the folding region 131c. Although the first region 131a may include a notch region (e.g., notch region 133 in FIG. 1C) cut according to the presence of the sensor region 131d, the first region 131a may have a symmetrical shape with the second region 131b in other portions. In other words, the first region 131a and the second region 131b may include portions with symmetrical shapes and portions with asymmetrical shapes.

FIG. 1B is a diagram illustrating a folded state of the electronic device of FIG. 1A according to an embodiment.

Referring to FIG. 1B, the hinge cover 165 may be disposed between the first housing 110 and the second housing 120 so as to cover the internal components (e.g., hinge structure 164 in FIG. 1C). In an embodiment, the hinge cover 165 may be covered by portions of the first housing 110 and the second housing 120 or be exposed to the outside according to the operating state (e.g., flat state or folded state) of the electronic device 100.

For example, when the electronic device 100 is in the flat state as illustrated in FIG. 1A, the hinge cover 165 may be covered by the first housing 110 and the second housing 120 so as not to be exposed. When the electronic device 100 is in the folded state (e.g., completely folded state) as illustrated in FIG. 1B, the hinge cover 165 may be exposed to the outside between the first housing 110 and the second housing 120. When the electronic device 100 is in the intermediate state where the first housing 110 and the second housing 120 make a certain angle, the hinge cover 165 may be partially exposed to the outside between the first housing 110 and the second housing 120. In this case, the exposed portion may be less than that for the fully folded state. In an embodiment, the hinge cover 165 may include a curved surface.

A description is given of configurations of the first housing 110 and the second housing 120 and regions of the display 130 according to the operating state (e.g. flat state or folded state) of the electronic device 100.

In an embodiment, when the electronic device 100 is in the flat state (e.g., state of FIG. 1A), the first housing 110 and the second housing 120 may make an angle of 180 degrees, and the first region 131a and the second region 131b of the display may be disposed to face in the same direction. In addition, the folding region 131c may be coplanar with the first region 131a and the second region 131b.

In an embodiment, when the electronic device 100 is in the folded state (e.g., state of FIG. 1B), the first housing 110 and the second housing 120 may be disposed to face each other. The first region 131a and the second region 131b of the display 130 may face each other, making a narrow angle (e.g., between 0 degrees and 10 degrees). At least a portion of the folding region 131c may form a curved surface with a preset curvature.

In an embodiment, when the electronic device 100 is in the intermediate state, the first housing 110 and the second housing 120 may be disposed to make a certain angle. The first region 131a and the second region 131b of the display 130 may form an angle greater than that for the folded state and less than that for the flat state. At least a portion of the folding region 131c may form a curved surface with a preset curvature. This curvature may be less than that for the folded state.

FIG. 1C is an exploded perspective view of an electronic device according to an embodiment.

Referring to FIG. 1C, in an embodiment, the electronic device 100 may include a display 130, a support member assembly 160, at least one printed circuit board 170, a first housing 110, a second housing 120, a first rear cover 140, and a second rear cover 150. In the description, the display 130 may be referred to as a display unit, display module, or display assembly.

The display 130 may include a display panel 131 (e.g., flexible display panel), and at least one plate 132 or layer on which the display panel 131 is seated. In an embodiment, one or more plates 132 may include a conductive plate (e.g., Cu sheet or SUS sheet) disposed between the display panel 131 and the support member assembly 160. According to an embodiment, the conductive plate may be formed to have substantially the same area as that of the display, and an area facing a folding area of the display may be formed to be bendable. The plate 132 may include at least one subsidiary material layer (e.g., graphite member) disposed at a rear surface of the display panel 131. In an embodiment, the plate 132 may be formed in a shape corresponding to the display panel 131. For example, a partial area of the first plate 132 may be formed in a shape corresponding to the notch area 133 of the display panel 131.

The support member assembly 160 may include a first support member 161, a second support member 162, a hinge structure 164 disposed between the first support member 161 and the second support member 162, a hinge cover 165 to cover the hinge structure 164 when viewed from the outside, and a wiring member 163 (e.g., flexible printed circuit board (FPCB)) that crosses the first support member 161 and the second support member 162.

In an embodiment, the support member assembly 160 may be disposed between the plate 132 and at least one printed circuit board 170. For example, the first support member 161 may be disposed between the first region 131a of the display 130 and the first printed circuit board 171. The second support member 162 may be disposed between the second region 131b of the display 130 and the second printed circuit board 172.

In an embodiment, at least a portion of the wiring member 163 and the hinge structure 164 may be disposed within the support member assembly 160. The wiring member 163 may be disposed in a direction crossing the first support member 161 and the second support member 162 (e.g., x-axis direction). The wiring member 163 may be disposed in a direction (e.g., x-axis direction) perpendicular to the folding axis (e.g., y-axis or folding axis (A) in FIG. 1B) of the folding region 131c.

The at least one printed circuit board 170 may include, as described above, the first printed circuit board 171 disposed on the side of the first support member 161, and the second printed circuit board 172 disposed on the side of the second support member 162. The first printed circuit board 171 and the second printed circuit board 172 may be disposed inside the space formed by the support member assembly 160, the first housing 110, the second housing 120, the first rear cover 140, and the second rear cover 150. Various components for implementing functions of the electronic device 100 may be mounted on the first printed circuit board 171 and the second printed circuit board 172.

In an embodiment, a first space of the first housing 110 may include a first printed circuit board 171 disposed in a space formed through the first support member 161, a first battery 191 disposed at a position facing a first swelling hole 1611 of the first support member 161, at least one sensor module 181, or at least one camera module 182. The first housing 110 may include a window glass 183 disposed to protect at least one sensor module 181 and at least one camera module 182 at a position corresponding to the notch area 133 of the display 130. In an embodiment, the second space of the second housing 120 may include a second printed circuit board 172 disposed in a second space formed through the second support member 162 and a second battery 192 disposed at a position facing the second swelling hole 1621 of the second support member 162. According to an embodiment, the first housing 110 and the first support member 161 may be integrally formed. According to an embodiment, the second housing 120 and the second support member 162 may also be integrally formed. According to an embodiment, a sub display 152 may be disposed in the second space of the second housing 120. According to an embodiment, the sub display 152 (e.g., the second display) may be disposed to be visible from the outside through at least a partial area of the second rear cover 150.

In an embodiment, the first housing 110 may include a first rotary support surface 114, and the second housing 120 may include a second rotary support surface 124 corresponding to the first rotary support surface 114. The first rotary support surface 114 and the second rotary support surface 124 may include a curved surface corresponding to the curved surface included in the hinge cover 165.

In an embodiment, when the electronic device 100 is in the flat state (e.g., state of FIG. 1A), the first rotary support surface 114 and the second rotary support surface 124 may cover the hinge cover 165 so that the hinge cover 165 may be not or minimally exposed to the rear surface of the electronic device 100. When the electronic device 100 is in the folded state (e.g., state of FIG. 1B), the first rotary support surface 114 and the second rotary support surface 124 may rotate along the curved surface included in the hinge cover 165 so that the hinge cover 165 may be maximally exposed to the rear surface of the electronic device 100.

In the following description, the same or similar component is assigned the same reference numeral except a case where the component is separately indicated. Furthermore, a description of a reference numeral for the same member may be omitted.

Figure 2A:
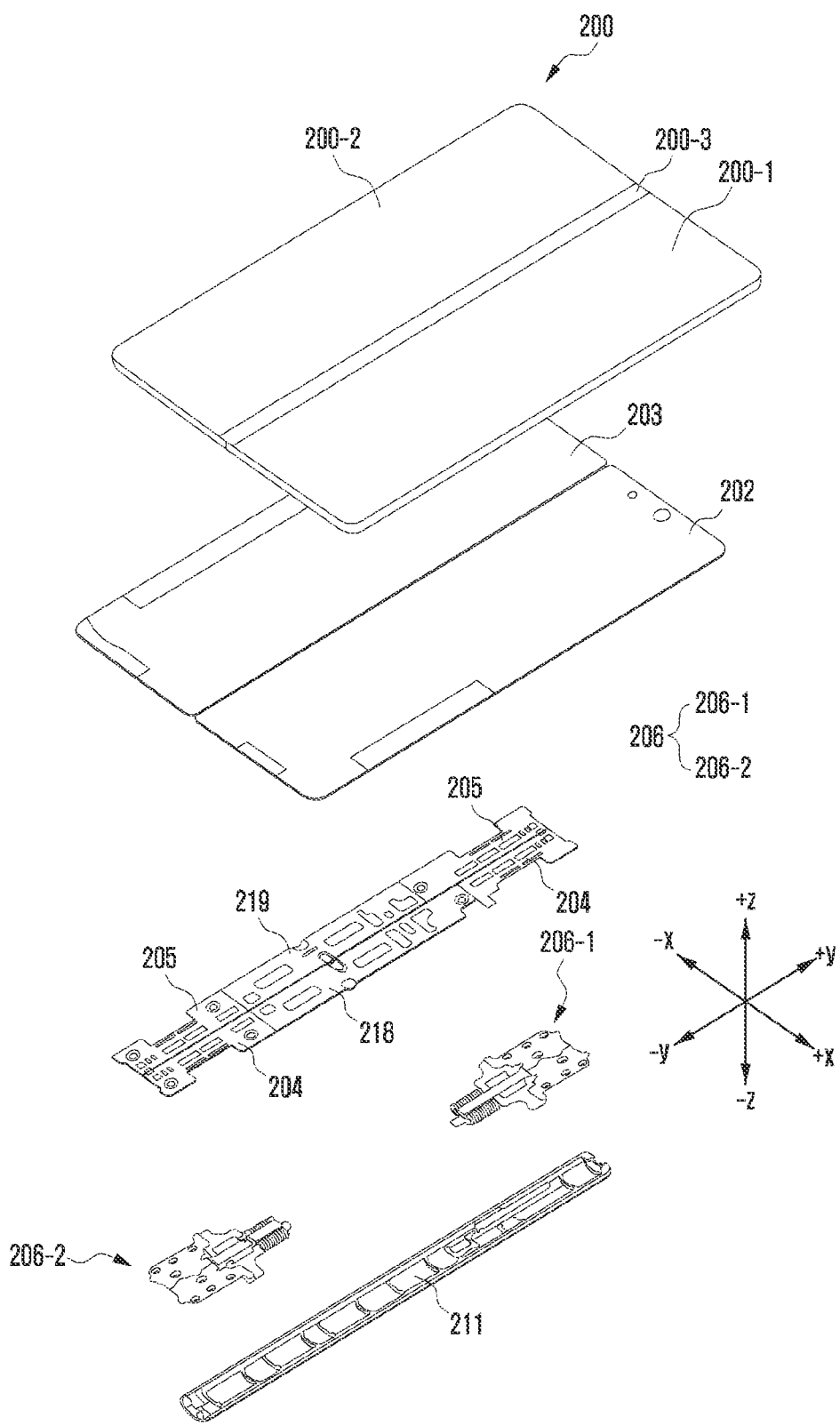
FIG. 2A is an exploded perspective view illustrating components of the electronic device according to various embodiments.
Figure 2B:
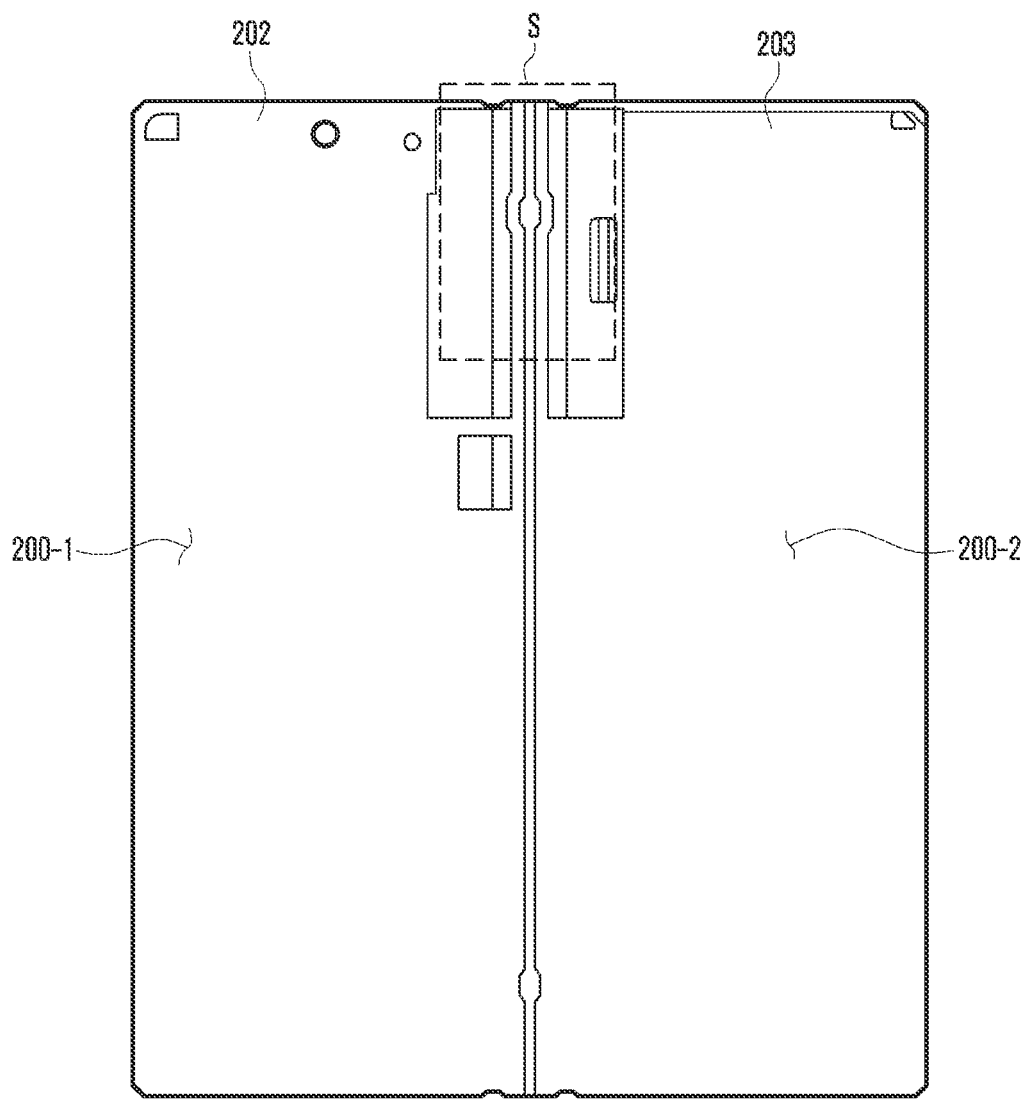
FIG. 2B is a diagram illustrating a display panel, a rear surface of a first plate, and a rear surface of a second plate according to various embodiments.
Figure 2C:
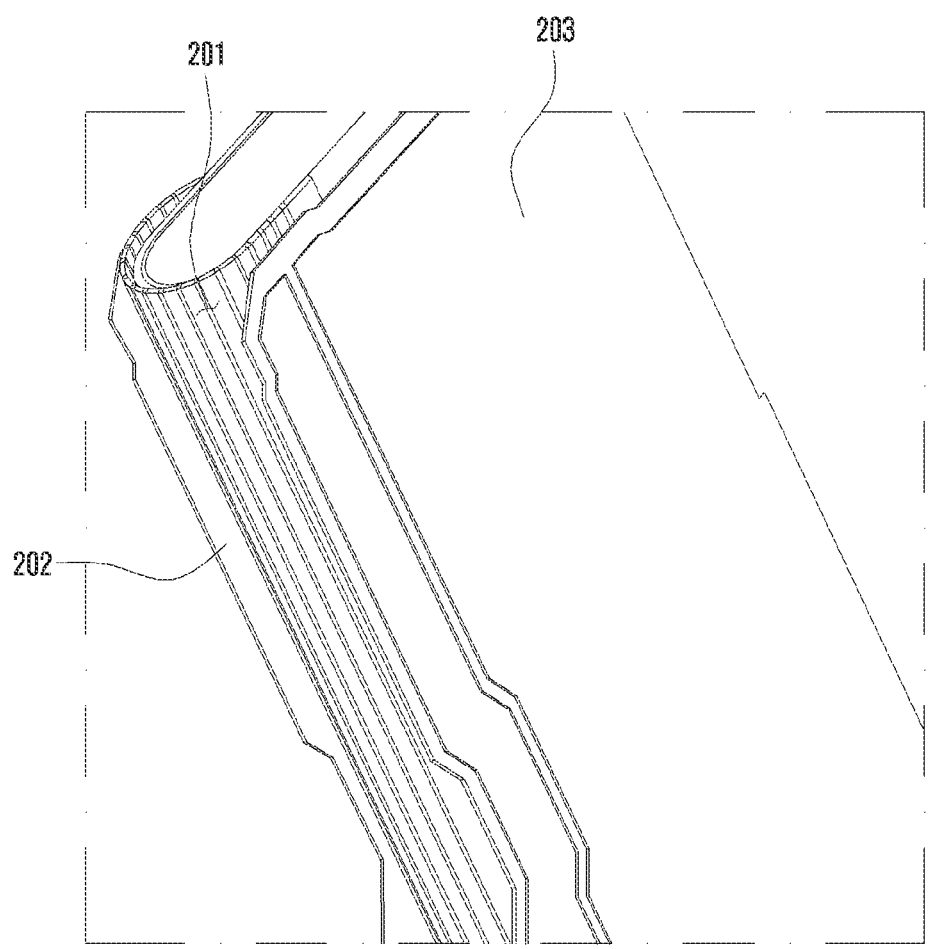
FIG. 2C is an enlarged view of an area S in FIG. 2B in the state in which the display panel in FIG. 2B has been folded according to various embodiments.

FIG. 2A is an exploded perspective view illustrating components of the electronic device according to various embodiments. FIG. 2B is a diagram illustrating a display panel, a rear surface of a first plate, and a rear surface of a second plate according to various embodiments. FIG. 2C is an enlarged perspective view of an area S in FIG. 2B in the state in which the display panel in FIG. 2B has been folded according to various embodiments.

According to various embodiments, as illustrated in FIG. 2A, the electronic device 100 (e.g., the electronic device 100 in FIG. 1A) may include a display panel 200 (e.g., the display 130 in FIG. 1A) providing visual information, a first plate 202 (e.g., the plate 132 in FIG. 1C) and a second plate 203 (e.g., the plate 132 in FIG. 1C) supporting the display panel 200, a hinge part 206 (e.g., the hinge 164 in FIG. 1C), a third plate 204 and a fourth plate 205 combined with the hinge part 206, and a hinge cover 211 (e.g., the hinge cover 165 in FIG. 1B) at least a part of which forms an external appearance of the electronic device 100.

Hereinafter, for convenience sake, a direction (e.g., a +Z direction in FIG. 2A) of the display panel 200 visible to the outside of the electronic device 100 is defined and described as a front surface, and a direction (e.g., a −Z direction in FIG. 2A) opposite to the direction of the front surface is defined and described as a rear surface.

According to various embodiments, the display panel 200 may provide visual information. The display panel 200 may be a flexible display at least some area of which is foldable. The display panel 200 may include a first area 200-1 (e.g., the first area 131a in FIG. 1A) which is disposed in a first housing 110 (e.g., the first housing 110 in FIG. 1A) is disposed and to which the first plate 202 is attached, a second area 200-2 (e.g., the second area 131b in FIG. 1A) which is disposed in a second housing 120 (e.g., the second housing 120 in FIG. 1A) is disposed and to which the second plate 203 is attached, and a folding area 200-3 (e.g., the folding area 131c in FIG. 1A) foldable between the first area 200-1 and the second area 200-2. In this case, the first area 200-1, the second area 200-2, and the folding area 200-3 are merely conceptually divided in order to describe the display panel 200, and may not be components physically divided on the display panel 200. In an embodiment, the display panel 200 may be integrated and formed using one material.

According to various embodiments, a support member 201 (e.g., the support member 201 in FIG. 2C) may be attached or connected to the rear surface of the display panel 200. The support member 201 may be formed to have substantially the same area as the display panel 200. An area of the support member 201, which corresponds to the folding area 200-3 of the display panel 200, may be formed in a way to be bendable. The support member 201 may include a plate or sheet form. The support member 201 may include a conductive plate, but the disclosure is not limited thereto. In an embodiment, at least another layer may be further included between the display panel 200 and the support member 201. In an embodiment, the support member 201 may be omitted. Hereinafter, it is to be noted that the support member 201 is denoted and described as the display panel 200, but the support member 201 may be a component attached to the display panel 200, for convenience sake.

According to various embodiments, the display panel 200 may be formed using various materials. In an embodiment, the display panel 200 may be formed using a flexible material. For example, a substrate of a display module may be formed using a polymer material, such as polyethylene terephthalate (PET) or polyimide (PI) or glass processed to a very thin thickness.

According to various embodiments, the first plate 202 may support at least a part of the first area 200-1 of the display panel 200. The second plate 203 may support at least a part of the second area 200-2 of the display panel 200. The first plate 202 may prevent and/or reduce a shape of the first area 200-1 of the display panel 200 from being deformed due to an external force. For example, the first plate 202 may be attached and fixed to the first area 200-1 through an adhesive member, and may enable the first area 200-1 to maintain a plane. The second plate 203 may prevent and/or reduce a shape of the second area 200-2 of the display panel 200 from being deformed due to an external force. For example, the second plate 203 may be attached and fixed to the second area 200-2 through an adhesive member, and may enable the second area 200-2 to maintain a plane. Hereinafter, the first plate 202 is basically described for convenience sake, but those skilled in the art will readily understand that the first plate 202 may also be applied to the second plate 203.

According to various embodiments, the first plate 202 may support the first area 200-1 so that the size of the first plate 202 substantially corresponds to the size of the first area 200-1 of the display panel 200. In an embodiment, the first plate 202 may have a size including the size of the first area 200-1 and the size of a part of the folding area 200-3. The size of the second plate 203 may substantially correspond to the size of the second area 200-2 of the display panel 200, or may be a size including the second area 200-2 and a part of the folding area 200-3. If the size of each of the first plate 202 and the second plate 203 is a size including a part of the folding area 200-3, with reference to FIG. 2B, in the unfolded stage, the first plate 202 may support the first area 200-1 and some area of the folding area 200-3, and the second plate 203 may support the second area 200-2 and other some area of the folding area 200-3. The remaining area of the folding area 200-3 other than some area of the folding area 200-3 supported by the first plate 202 and the other some area of the folding area 200-3 supported by the second plate 203 may not be supported by the first plate 202 and/or the second plate 203. In an embodiment, with reference to FIG. 2C, in the folded state, the first plate 202 and the second plate 203 support the first area 200-1 and the second area 200-2, but may not support the folding area 200-3. The first plate 202 and the second plate 203 may have symmetrical shapes, but the disclosure is not limited thereto. For example, the first plate 202 and the second plate 203 may have different shapes.

According to various embodiments, a separate instrument supporting at least some of the folding area 200-3 may not be disposed on the rear surface of the display panel 200. For example, the first area 200-1 may be supported as the first plate 202 is disposed therein, and the second area 200-2 may be supported as the second plate 203 is disposed therein, but at least some area (e.g., an intermediate area) of the folding area 200-3 in which the first plate 202 and/or the second plate 203 are not disposed may not be supported by an instrument (e.g., supported through adhesion or a contact).

According to various embodiments, the first plate 202 and the second plate 203 may be formed using a material having given strength or more. The first plate 202 and the second plate 203 may be formed using a material having higher strength than that of the display panel 200 in order to support the display panel 200. For example, the first plate 202 and the second plate 203 may be formed using a metal material and/or a non-metal material. In this case, the metal material may include at least one of aluminum, stainless steel (SS), iron, magnesium, or titanium or an alloy thereof. The non-metal material may include at least one of synthetic resin, ceramics, or engineering plastic.

According to various embodiments, as illustrated in FIG. 2A, the hinge part (the term "hinge part" may be used interchangeably with the term "hinge" herein) 206 may include a first hinge 206-1 and a second hinge 206-2. For example, the first hinge 206-1 may be disposed at an end of the electronic device 100 in a +Y direction (e.g., a +Y direction in FIG. 2A). The second hinge 206-2 may be disposed at an end of the electronic device 100 in a –Y direction (e.g., a –Y direction in FIG. 2A). The first hinge 206-1 and the second hinge 206-2 may be disposed to be symmetrical to each other on the basis of an X axis in FIG. 2A. The hinge part 206 may connect the first housing 110 and the second housing 120, and may rotate the second housing 120 within a designated rotating range on the basis of the first housing 110 or may rotate the first housing 110 within a designated rotating range on the basis of the second housing 120. For example, the hinge part 206 may provide the rotating axis of the first or second housing 110 or 120, and may provide torque so that a state of the electronic device 100 is maintained at a specific angle, for example, 0 degree, 45 degrees, 90 degrees or 180 degrees. The first hinge 206-1 and the second hinge 206-2 may have substantially the same shape, but the disclosure is not limited thereto. For example, the first hinge 206-1 and the second hinge 206-2 may have different components and/or sizes. Furthermore, although not illustrated, those skilled in the art may readily understand that the hinge part 206 may include one hinge or three or more hinges. Hereinafter, for convenience sake, the hinge part 206 is denoted and described, but it is to be noted that the hinge part 206 may be applied to any one of or both the first hinge 206-1 and the second hinge 206-2.

According to various embodiments, although not illustrated, the hinge part 206 may further include a support bar (not illustrated) connecting the first hinge 206-1 and the second hinge 206-2. For example, the support bar is a plate bar type having a length whose both ends are fixed to the hinges 206-1 and 206-2 so that the support bar can be disposed between both the hinges 206-1 and 206-2. When the electronic device 100 is in the unfolded stage and/or the folded state, the support bar may support at least some of a folding area 200-3 (e.g., the folding area 131c in FIG. 1A) of the display panel 200. The support bar may be a metal material, for example, a stainless steel (SS) material or a metal powder material.

According to various embodiments, the third plate 204 may be disposed in the –Z direction with respect to the first plate 202 on the basis of FIG. 2A. The fourth plate 205 may be disposed in the –Z direction with respect to the second plate 203 on the basis of FIG. 2A. The third plate 204 and the fourth plate 205 may have symmetrical shapes, but the disclosure is not limited thereto. For example, the third plate 204 and the fourth plate 205 may be formed to have different sizes.

According to various embodiments, the third plate 204 may include a first auxiliary plate 218. In an embodiment, the first auxiliary plate 218 may be integrated and formed with the third plate 204. For example, the first auxiliary plate 218 may denote a central part of the third plate 204 extending in the Y axis direction in FIG. 2A, and may indicate a portion of the third plate 204 in which the wiring member 163 (e.g., a flexible printed circuit board (FPCB) (e.g., the wiring member 163 in FIG. 1C) is disposed. Accordingly, the first auxiliary plate 218 may not be a component that is actually distinguished from the third plate 204. In an embodiment, the first auxiliary plate 218 may be combined with the third plate 204 through separate coupling as a component separated from the third plate 204. In this case, the third plate 204 has a plurality of components, and may be separated and disposed at the ends of the electronic device 100 in the +Y direction and the –Y direction on the basis of FIG. 2A. The first auxiliary plate 218 may be combined with the third plate 204 through at least one of welding, a connection member (e.g., a screw, a clip, or a bolt and a nut), or an adhesive member (e.g., a bond or a tape) with the separated third plates 204. Likewise, the fourth plate 205 may include a second auxiliary plate 219. In an embodiment, the second auxiliary plate 219 may be integrated and formed with the fourth plate 205. For example, the second auxiliary plate 219 may denote the central part of the fourth plate 205 extending in the Y axis direction in FIG. 2A. The second auxiliary plate 219 may indicate a portion of the fourth plate 205 in which the wiring member 163 is disposed. Accordingly, the second auxiliary plate 219 may not be a component that is actually distinguished from the fourth plate 205. In an embodiment, the second auxiliary plate 219 may be combined with the fourth plate 205 through separate coupling as a component separated from the fourth plate 205. In this case, the fourth plate 205 may be separated and disposed at the ends of the electronic device 100 in the +Y direction and the −Y direction on the basis of FIG. 2A. The second auxiliary plate 219 may be formed separately from the fourth plate 205, and may be combined with the fourth plate 205 through at least one of welding, a connection member (e.g., a screw, a clip, or a bolt and a nut), or an adhesive member (e.g., a bond or a tape).

According to various embodiments, the wiring member 163 may be disposed on the front surface of the third plate 204 and the fourth plate 205. The wiring member 163 may be disposed in the central part of the electronic device 100 and disposed in a direction (e.g., the X axis direction in FIG. 2A) that intersects the third plate 204 and the fourth plate 205. For example, the wiring member 163 may be disposed in a direction (e.g., the X axis direction in FIG. 2A) perpendicular to a folding axis (e.g., the Y axis direction in FIG. 2A) of the folding area 200-3. In an embodiment, the wiring member 163 may be supported by the third plate 204 and the fourth plate 205. In an embodiment, the wiring member 163 may be supported by the first auxiliary plate 218 of the third plate 204 and the second auxiliary plate 219 of the fourth plate 205.

According to various embodiments, the hinge cover 211 may be disposed between the first housing 110 and the second housing 120, and may cover the hinge part 206 and form an external appearance of the electronic device 100. The hinge cover 211 may be covered by the first housing 110 and the second housing 120 when a state of the electronic device 100 is the unfolded stage, and may be exposed to the outside when a state of the electronic device 100 is the folded state, but the disclosure is not limited thereto. For example, the hinge cover 211 may be always exposed to the outside. In an embodiment, the hinge cover 211 may have a shape corresponding to an arrangement shape of the hinge part 206. For example, as the first hinge 206-1 and the second hinge 206-2 are disposed in the Y axis in FIG. 2A, the first hinge 206-1 and the second hinge 206-2 may be provided in a form generally elongating in the Y axis direction. Some area of the inside of the hinge cover 211 may include a fixing part 212 for fixing the first hinge 206-1 and the second hinge 206-2.

According to various embodiments, components of the electronic device 100 may be disposed in the electronic device 100 in a stack order, such as that illustrated in FIG. 2A. For example, components of the electronic device 100 may be disposed in order of the display panel 200, the first plate 202 and the second plate 203 supporting the display panel 200, the third plate 204 and the fourth plate 205 combined with the first plate 202, the second plate 203, and the hinge part 206 so that the first plate 202 and the second plate 203 are rotated and moved, and the hinge cover 211 combined with the hinge part 206 and forming an external appearance of the electronic device 100, from the +Z direction to the −Z direction on the basis of FIG. 2A.

According to various embodiments, a front surface (e.g., a surface toward the +Z direction in FIG. 2A) of the first plate 202 may be attached to the first area 200-1 of the display panel 200 through an adhesive member. The front surface of the second plate 203 may also be attached to the second area 200-2 of the display panel 200 through an adhesive member.

According to various embodiments, the third plate 204 and the fourth plate 205 may be combined with the hinge part 206. One end (e.g., the +Y direction in FIG. 2A) of the third plate 204 and the fourth plate 205 may be combined with the first hinge 206-1. The other end (e.g., the −Y direction in FIG. 2A) of the third plate 204 and the fourth plate 205 opposite to the one end may be combined with the second hinge 206-2. The third plate 204 and the fourth plate 205 may be combined with the hinge part 206 using various methods. For example, the third plate 204 and the fourth plate 205 may be combined with the hinge part 206 through at least one of a connection member (e.g., a screw or a bolt and a nut), welding, a clip, a hook, or a tape.

According to various embodiments, the third plate 204 and the first plate 202, and the fourth plate 205 and the second plate 203 may be connected using various methods.

In an embodiment, the third plate 204 may be directly combined with the first plate 202. For example, at least a part of the third plate 204 may be attached and fixed to at least a part of the first plate 202 through an adhesive member. In addition, the third plate 204 may be combined with the first plate 202 using various methods, such as a screw, a clip, a tape, welding, and a rivet. Likewise, the fourth plate 205 may be directly combined with the second plate 203. For example, at least a part of the fourth plate 205 may be attached and fixed to at least a part of the second plate 203 through an adhesive member. In addition, the fourth plate 205 may be directly combined with the second plate 203 using various methods, such as a screw, a clip, a tape, welding, and a rivet.

In an embodiment, the third plate 204 and the first plate 202, and the fourth plate 205 and the second plate 203 may be indirectly connected. In this case, "indirectly connected" may refer, for example, to the third plate 204 and the first plate 202, and the fourth plate 205 and the second plate 203 not being directly connected through at least one of adhesive members, but being connected through separate members between the third plate 204 and the first plate 202 and between the fourth plate 205 and the second plate 203, respectively. For example, a buffering member 315 (refer to FIG. 4D) may be disposed between the third plate 204 and the first plate 202 and between the fourth plate 205 and the second plate 203. As the buffering member 315 is combined with the third plate 204 and the first plate 202 through an adhesive member, the third plate 204 and the first plate 202 may be indirectly connected. Likewise, as the buffering member 315 is combined with the fourth plate 205 and the second plate 203 through an adhesive member, the fourth plate 205 and the second plate 203 may be indirectly connected.

According to various embodiments, the first hinge 206-1 and the hinge cover 211 may be combined through a connection member (e.g., a screw, a clip, or a bolt and a nut). Furthermore, the second hinge 206-2 and the hinge cover 211 may also be combined through a connection member.

At least some of the aforementioned components may be omitted, and another component may be added. For example, an adhesive layer (not illustrated) may be further included between the display panel 200, and the first plate 202 and the second plate 203. A buffering member 315 (e.g., a buffering member 315 in FIG. 4D) may be further included between the first plate 202 and the third plate 204 and between the second plate 203 and the fourth plate 205.

Figure 3A:
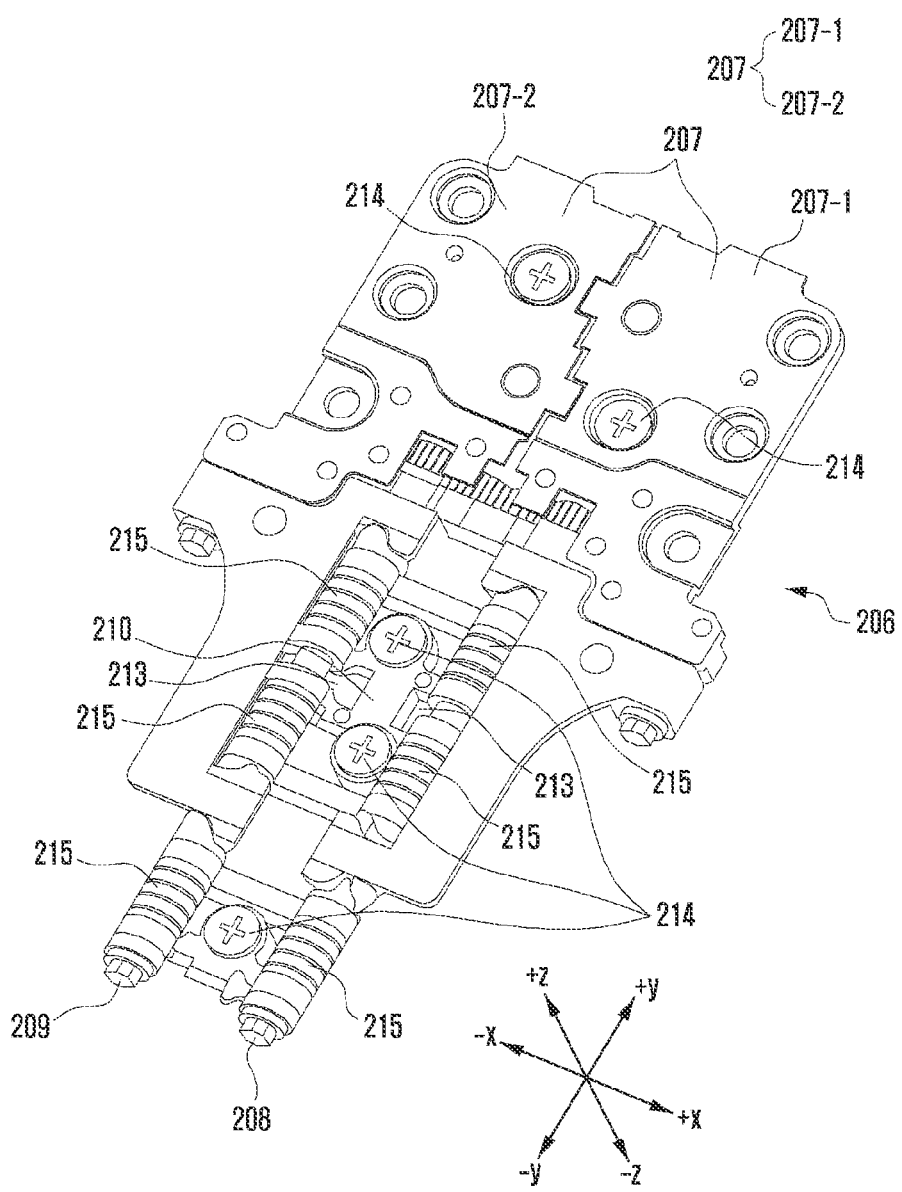
FIG. 3A is a perspective view of a hinge according to various embodiments.
Figure 3B:
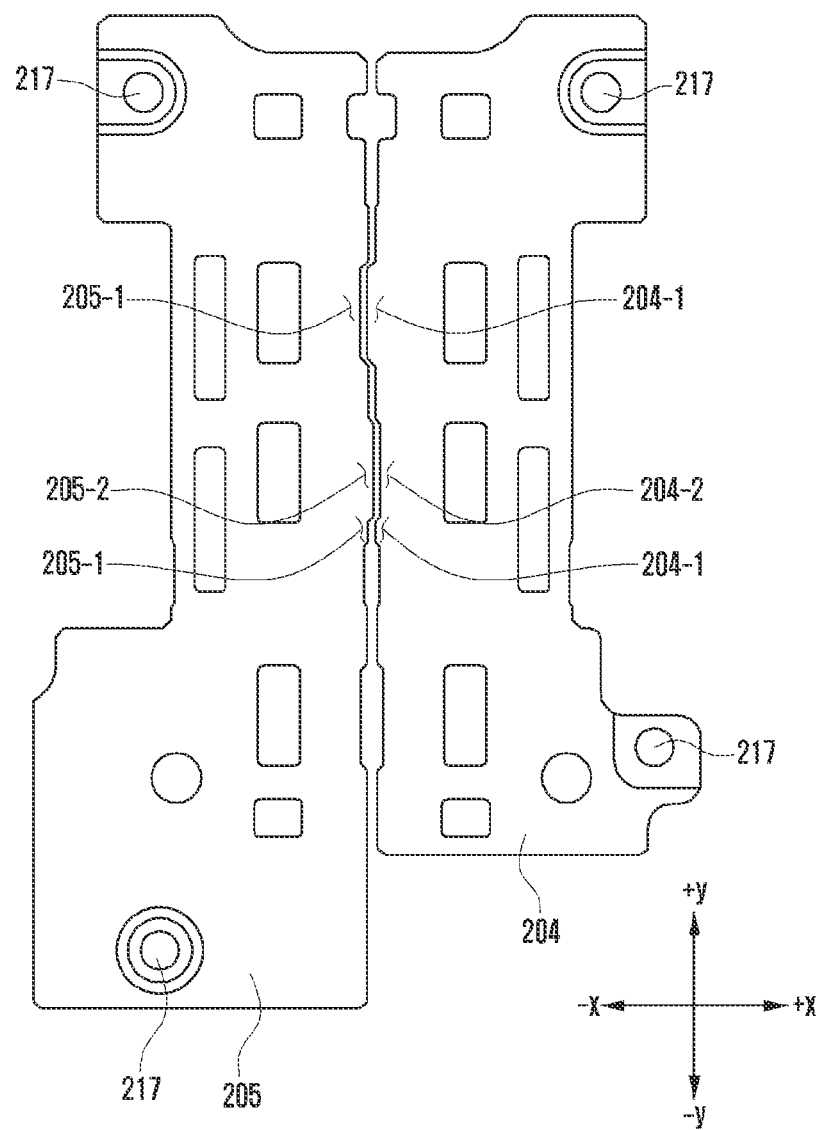
FIG. 3B is a diagram illustrating a third plate and a fourth plate combined with the hinge according to various embodiments.
Figure 3C:
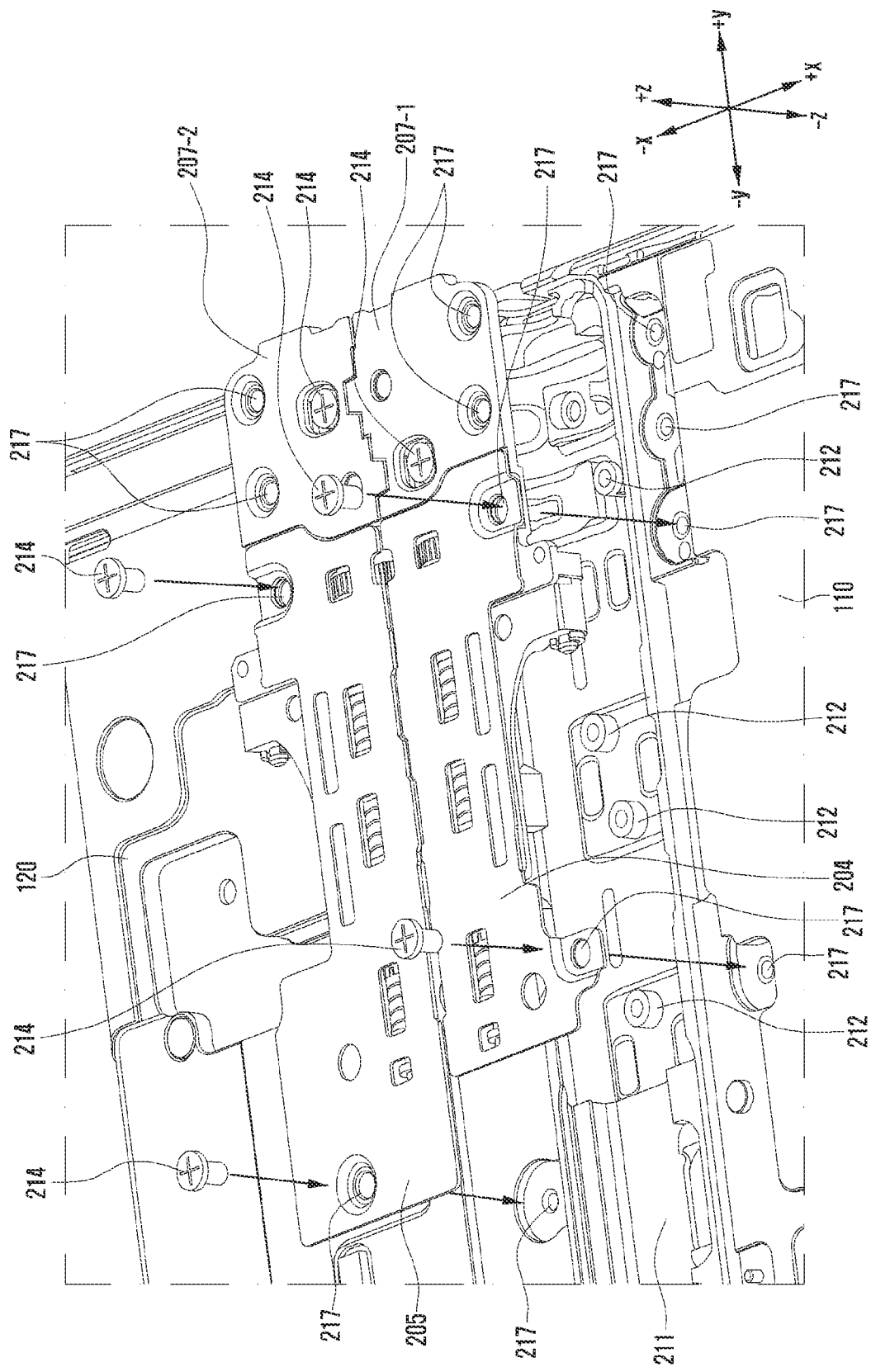
FIG. 3C is a view illustrating a state in which a hinge is assembled to a pair of housings according to various embodiments.

FIG. 3A is a perspective view of the hinge part according to various embodiments. FIG. 3B is a diagram illustrating the third plate and the fourth plate combined with the hinge part according to various embodiments. FIG. 3C is a view illustrating a state in which a hinge is assembled to a pair of housings according to various embodiments;

The hinge part 206 described hereinafter may be included in the electronic device 100 (e.g., the electronic device 100 in FIG. 1A) described with reference to FIGS. 1A to 1C. For example, the hinge part 206 may be included in the hinge 164 in FIG. 1C. As described with reference to FIG. 2A, the hinge part 206 may include a plurality of hinges (e.g., the first hinge 206-1 and the second hinge 206-2), and may be combined with the third plate 204 and the fourth plate 205. Hereinafter, for convenience sake, the first hinge 206-1 and the second hinge 206-2 are denoted and described as the hinge part 206, but may be applied to any one of or both the first hinge 206-1 and the second hinge 206-2.

According to various embodiments, as illustrated in FIG. 3A, the hinge part 206 may include a first bracket 207-1, a second bracket 207-2, a first shaft 208, a second shaft 209, a bearing body 210, and a plurality of elastic members 215. The hinge part 206 may be combined with another instrument through a bracket 207. In this case, the bracket 207 may include the first bracket 207-1 disposed in a first housing 110 (e.g., the first housing 110 in FIG. 1A) and the second bracket 207-2 disposed in a second housing 120 (e.g., the second housing 120 in FIG. 1A). The hinge part 206 may be rotated and moved through the first shaft 208 and the second shaft 209. Other instruments combined with the hinge part 206 may also be rotated through the first shaft 208 and the second shaft 209.

According to an embodiment, the bearing body 210 may include a shaft hole (not illustrated) capable of accommodating the first shaft 208 and the second shaft 209. The bearing body 210 may include at least one fixing hole 217 for fixing the hinge part 206 and a hinge cover 211 (e.g., the hinge cover 165 in FIG. 1B). The inside wall of the fixing hole 217 may include a screw for fixing a fixing member 214, but the disclosure is not limited thereto. The fixing member 214 may be inserted through the fixing hole 217, so the hinge cover 211 and the hinge part 206 may be connected. The bearing body 210 is described with reference to one reference numeral for convenience of description, but may be a component including a plurality of instruments. For example, the two shafts 208 and 209 may penetrate a plurality of instruments including the shaft hole and/or the fixing hole 217 and the elastic members 215.

According to an embodiment, the elastic member 215 may be compressed or extended when the electronic device 100 is rotated and moved from the folded state to the unfolded stage and/or from the unfolded stage to the folded state, thereby assisting a user's manipulation force or providing a user with a feeling of manipulation. All of the plurality of elastic members 215 may be formed using the same material, or at least one of the plurality of elastic members 215 may be formed using a different material or at least one of the length, diameter and/or thickness thereof may be different. In this case, the elastic member 215 may include a spring. The aforementioned components of the hinge part 206 are merely an example, and at least one of the components may be omitted or at least one component may be added.

According to various embodiments, as illustrated in FIGS. 3B and 3C, the third plate 204, the fourth plate 205, and the hinge part 206 may be combined with the housing 110 and 120. According to an embodiment, the fixing hole 217 may be formed in the third plate 204, the first bracket 207-1, and the first housing 110. A part of the third plate 204 may be combined with the first housing 110 along with the first bracket 207-1 through a fixing member 214 passing through the fixing hole 217. Furthermore, another part of the third plate 204 may be combined with the first housing 110 through the fixing member 214 passing through the fixing hole 217, without the first bracket 207-1. In the same coupling manner, the fixing hole 217 may be formed in the fourth plate 205, the second bracket 207-2, and the second housing 120. A part of the fourth plate 205 may be combined with the second housing 120 along with the second bracket 207-2 through the fixing member 214 passing through the fixing hole 217. Furthermore, another part of the fourth plate 205 may be combined with the second housing 120 through the fixing member 214 passing through the fixing hole 217, without the second bracket 207-2. In this case, the fixing hole 217 may include a screw, but the fixing member 214 may be fastened to the fixing hole 217 not having a screw in some cases. In addition, the third plate 204, the fourth plate 205, and the hinge part 206 may be combined with the housing 110 and 120 through at least one of welding, a clip, a hook, or a tape.

According to various embodiments, the first housing 110 and the second housing 120 may be combined with the hinge part 206, and may be rotated and moved through the first shaft 208 and second shaft 209 of the hinge part 206. As the first housing 110 and the second housing 120 are rotated and moved, the third plate 204 combined with the first housing 110 and the fourth plate 205 combined with the second housing 120 may be rotated within a designated rotating range. As a display panel 200 (e.g., the display 130 in FIG. 1A) is disposed in the housing 110 and 120, a first plate 202 (e.g., the plate 132 in FIG. 1C) may be disposed in the first housing 110, and a second plate 203 (e.g., the plate 132 in FIG. 1C) may be disposed in the second housing 120. As the first housing 110 and the second housing 120 are rotated and moved, the first plate 202 and the second plate 203 may be rotated within a designated rotating range.

According to various embodiments, the third plate 204 and the fourth plate 205 may be formed using a material having given strength or more. For example, the third plate 204 and the fourth plate 205 may be formed using a metal material and/or a non-metal material. In this case, the metal material may include at least one of aluminum, stainless steel (STS), iron, magnesium, or titanium or an alloy thereof. The non-metal material may include synthetic resin, ceramics, or engineering plastic.

Figure 4A:
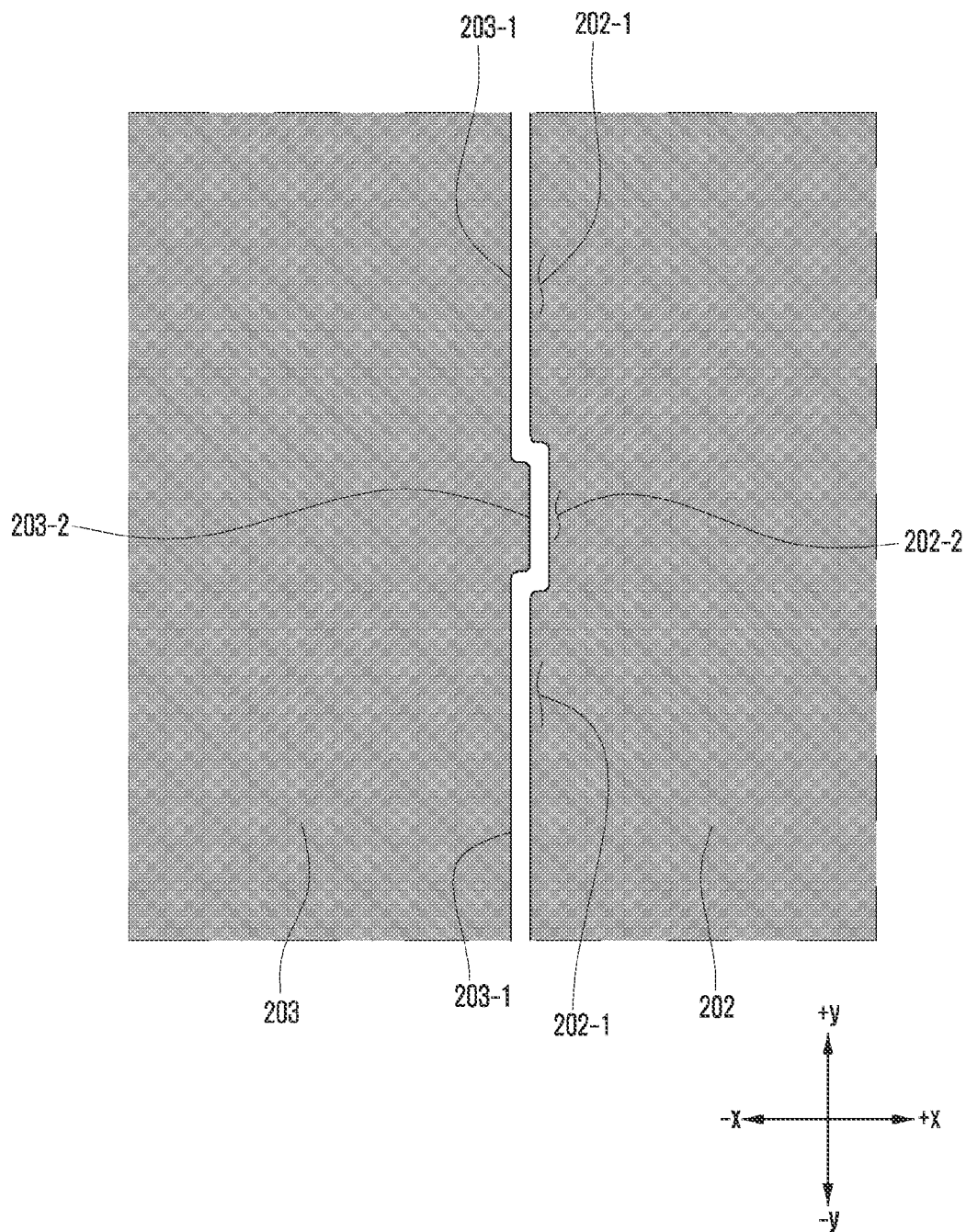
FIG. 4A is a partially enlarged diagram illustrating the first plate and the second plate according to various embodiments.
Figure 4B:
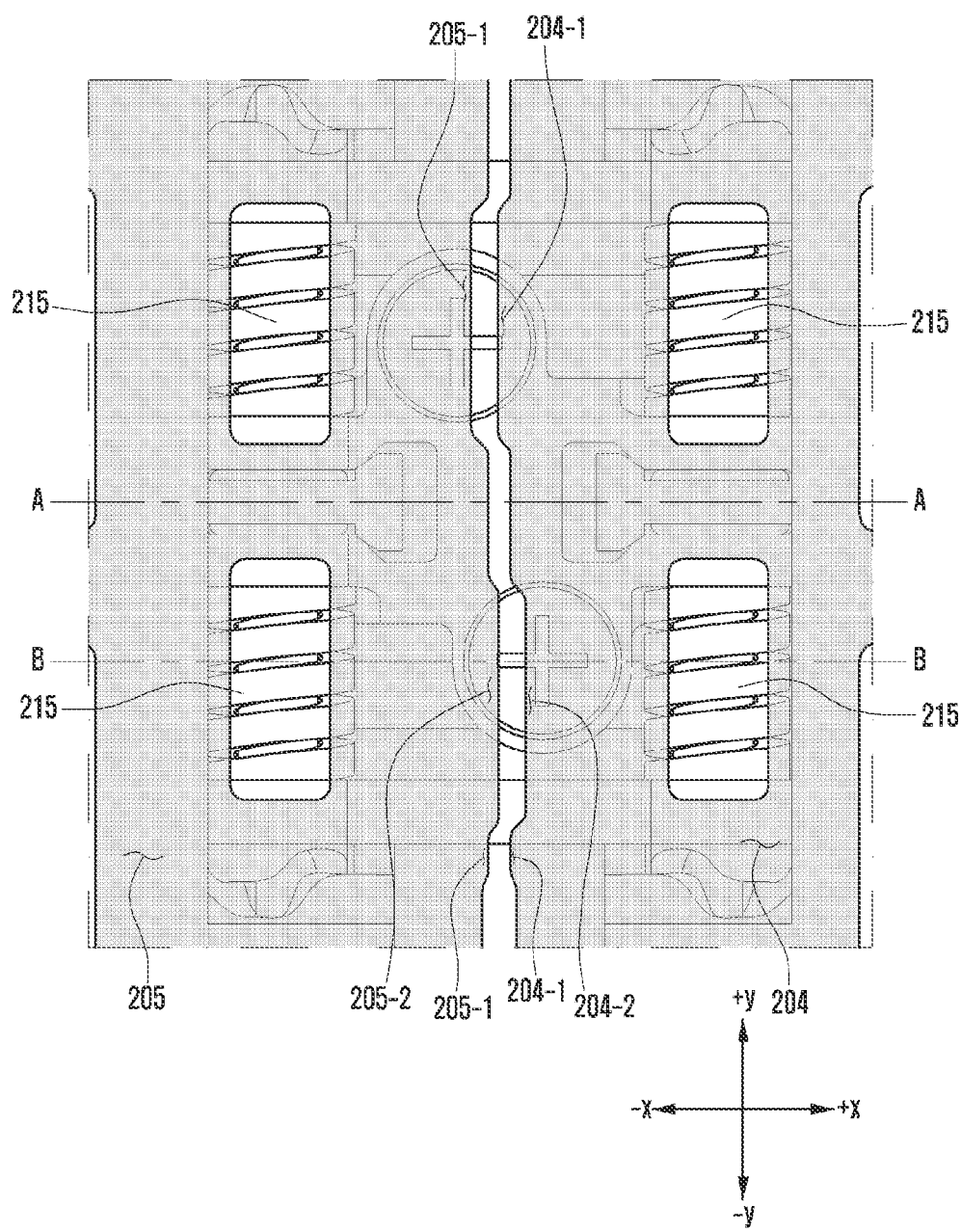
FIG. 4B is a partially enlarged diagram illustrating a state in which the third plate and the fourth plate are combined with the hinge according to various embodiments.
Figure 4C:
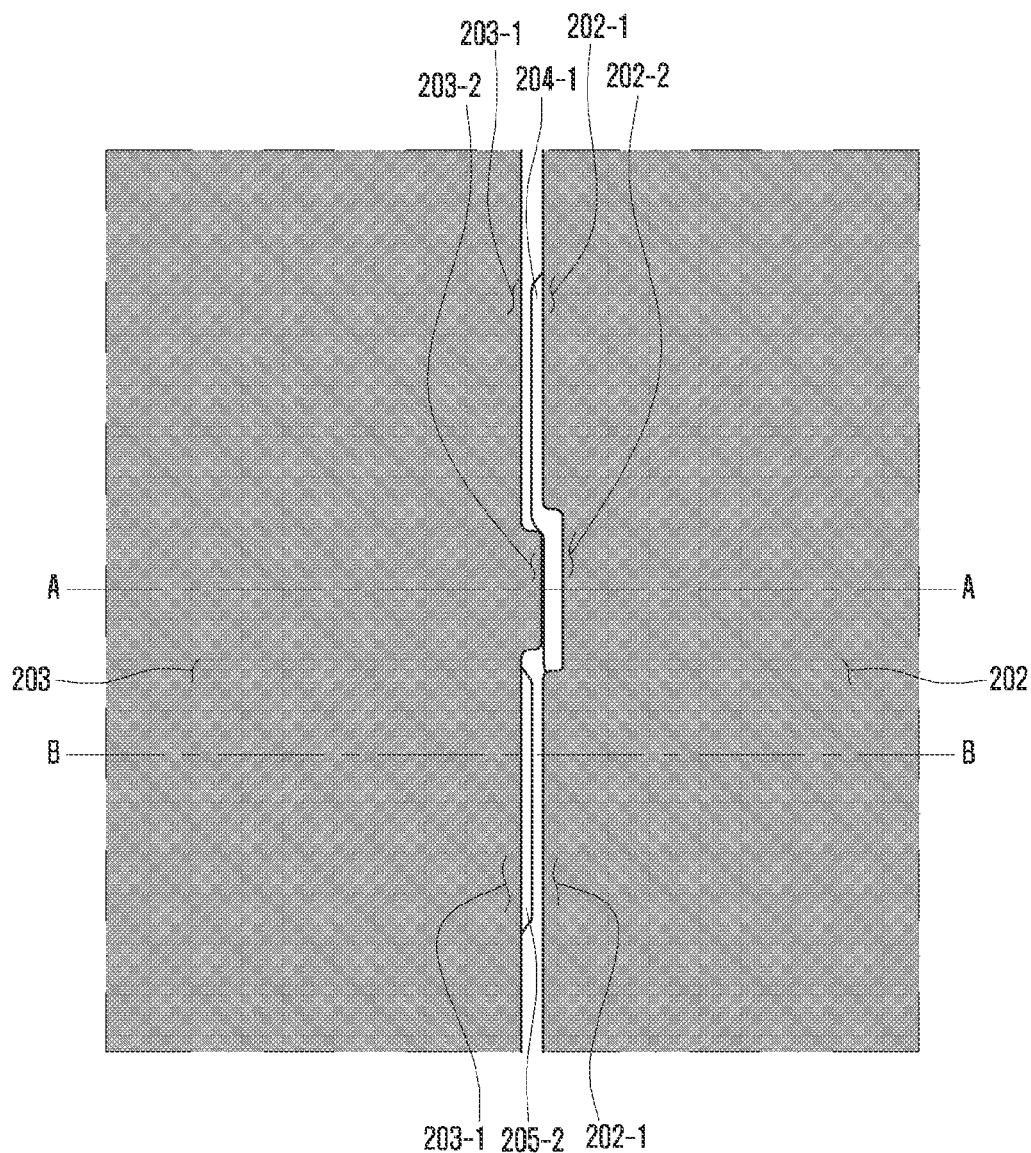
FIG. 4C is a partially enlarged view illustrating an example structure stacked in order of the hinge part—the third plate and the fourth plate—the first plate and the second plate according to various embodiments.
Figure 4D:
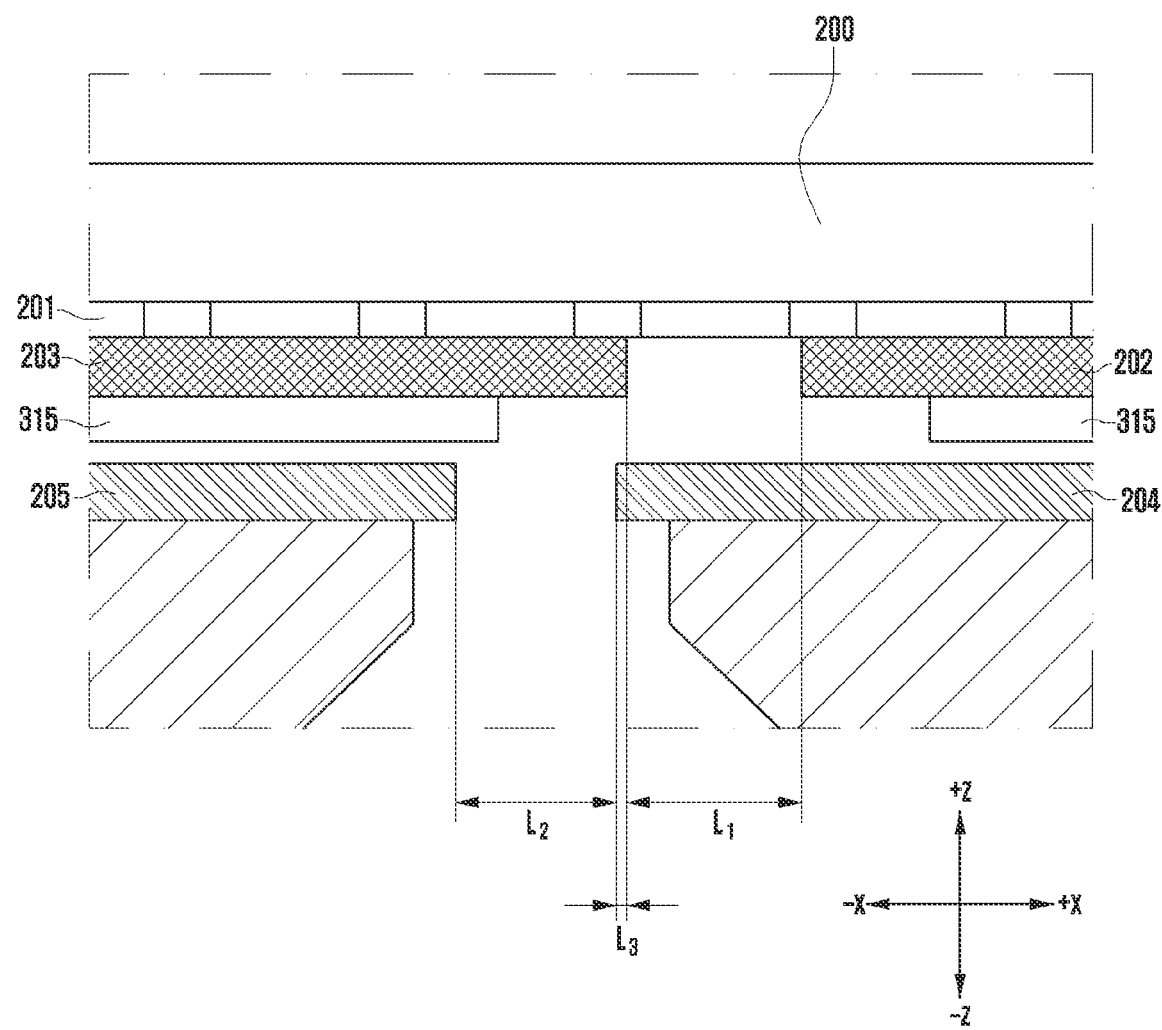
FIG. 4D is a cutaway cross-sectional view illustrating an example in which up to the third plate and the fourth plate have been stacked in the display panel along line A-A in FIG. 4C according to various embodiments.
Figure 4E:
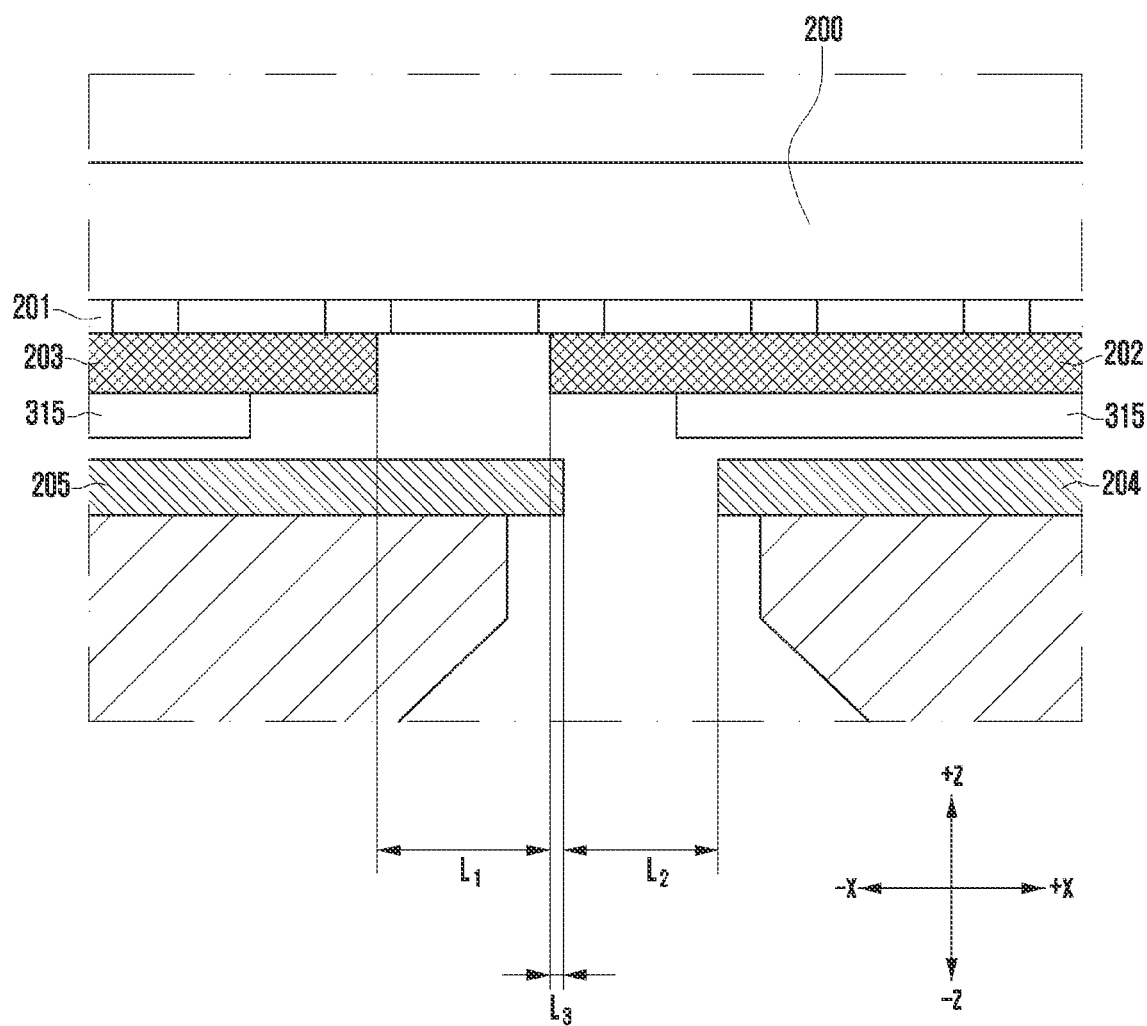
FIG. 4E is a cutaway cross-sectional view illustrating an example in which up to the third plate and the fourth plate have been stacked in the display panel along line B-B in FIG. 4C according to various embodiments.

FIG. 4A is a partially enlarged diagram of the first plate and the second plate according to various embodiments. FIG. 4B is a partially enlarged diagram illustrating a state in which the third plate and the fourth plate are combined with the hinge part according to various embodiments. FIG. 4C is a partially enlarged diagram illustrating a structure stacked in order of the hinge part—the third plate and the fourth plate—the first plate and the second plate according to various embodiments. FIG. 4D is a cutaway cross-sectional view illustrating an example construction in which up to the third plate and the fourth plate have been stacked in the display panel along line A-A in FIG. 4C according to various embodiments. FIG. 4E is a cutaway cross-sectional view illustrating an example construction in which up to the third plate and the fourth plate have been stacked in the display panel along line B-B in FIG. 4C according to various embodiments.

With reference to FIGS. 4A, 4B, 4C and 4E, a display panel 200 (e.g., the display 130 in FIG. 1A), a first plate 202 (e.g., the plate 132 in FIG. 1C) and a second plate 203 (e.g., the plate 132 in FIG. 1C), the third plate 204 and the fourth plate 205, and a hinge part 206 (e.g., the hinge 164 in FIG. 1C) may be sequentially stacked in the electronic device 100 (e.g., the electronic device 100 in FIG. 1A). The third plate 204 may be disposed in a −Z direction on the basis of FIG. 2A with respect to the first plate 202. The fourth plate 205 may be disposed in the −Z direction on the basis of FIG. 2A with respect to the second plate 203. A detailed stack structure of the electronic device 100 is as follows.

According to various embodiments, the display panel 200 may include the support member 201. The support member 201 may be attached to a rear surface (e.g., a surface toward the −Z direction in FIG. 2A) of the display panel 200 through an adhesive member. Hereinafter, for convenience sake, the display panel 200 may be referred to as including the support member 201. The first plate 202 may be disposed in the first area 200-1 (e.g., the first area 131*a* in FIG. 1A) of the display panel 200. The first plate 202 may be fixed to the first area 200-1 through an adhesive member. The first plate 202 has substantially the same size as the first area 200-1 of the display panel 200, but may have a size including the first area 200-1 and a part of a folding area 200-3 (e.g., the folding area 131*c* in FIG. 1A). The second plate 203 may be disposed in the second area 200-2 (e.g., the second area 131*b* in FIG. 1A) of the display panel 200. The second plate 203 may be fixed to the second area 200-2 through an adhesive member. The second plate 203 has substantially the same size as the second area 200-2 of the display panel 200, but may have a size including the second area 200-2 and a part of the folding area 200-3. The third plate 204 and the fourth plate 205 connected to the hinge part 206 may be disposed in the −Z direction on the basis of FIG. 2A with respect to the first plate 202 and the second plate 203.

According to various embodiments, the buffering member 315 may be disposed between the first plate 202 and the third plate 204 and between the second plate 203 and the fourth plate 205. In an embodiment, as illustrated in FIGS. 4D and 4E, the buffering member 315 may be fixed to the first plate 202 and the second plate 203 through an adhesive member. In an embodiment, the buffering member 315 may be fixed to the third plate 204 and the fourth plate 205 through an adhesive member. The buffering member 315 may absorb an impact occurring between the first plate 202 and the third plate 204 and between the second plate 203 and the fourth plate 205. The buffering member 315 may be formed using various materials. For example, the buffering member 315 may be formed using at least one material of rubber, urethane, or silicon.

According to various embodiments, the buffering member 315 may indirectly connect the first plate 202 and the third plate 204. The buffering member 315 may be disposed between the first plate 202 and the third plate 204. One surface (e.g., a surface toward a +Z direction in FIG. 4D) of the buffering member 315 toward the first plate 202 may be fixed to the first plate 202 through an adhesive member. The other surface (e.g., a surface toward a −Z direction in FIG. 4D) of the buffering member 315 toward the third plate 204 may be fixed to the third plate 204 through an adhesive member. Accordingly, the first plate 202 and the third plate 204 may be indirectly connected through the buffering member 315. Likewise, the buffering member 315 may indirectly connect the second plate 203 and the fourth plate 205. The buffering member 315 may be disposed between the second plate 203 and the fourth plate 205. One surface (e.g., the surface toward the +Z direction in FIG. 4D) of the buffering member 315 toward the second plate 203 may be fixed to the second plate 203 through an adhesive member. The other surface (e.g., the surface toward the −Z direction in FIG. 4D) of the buffering member 315 toward the fourth plate 205 may be fixed to the fourth plate 205 through an adhesive member. Accordingly, the second plate 203 and the fourth plate 205 may be indirectly connected through the buffering member 315.

According to various embodiments, as illustrated in FIGS. 4C and 4D, the first plate 202 and the second plate 203 may be fixed to the display panel 200, and may be disposed in a first housing 110 (e.g., the first housing 110 in FIG. 1A) and a second housing 120 (e.g., the second housing 120 in FIG. 1A). Accordingly, a first interval L1 (e.g., L1 in FIG. 4D) between one end of the first plate 202 and one end of the second plate 203 may be disposed in at least a part of a folding area 200-3 (e.g., the folding area 131*c* in FIG. 1A) of the display panel 200. For example, an area of the folding area 200-3 that corresponds to the first interval L1 may not be supported by the first plate 202 and/or the second plate 203. In another example not illustrated, if another support structure is not present in the direction (e.g., the −Z direction in FIG. 4D) of the rear surface of the area of the folding area 200-3 that corresponds to the first interval L1, when an external force (e.g., a force applied in the −Z direction in FIG. 4D) is applied to the folding area 200-3 of the display panel 200, the area of the folding area 200-3 that corresponds to the first interval L1 may be damaged by the external force. According to various embodiments of the disclosure, at least some of the area of the folding area 200-3 that corresponds to the first interval L1 may be supported by another instrument (e.g., the third plate 204 and/or the fourth plate 205), thereby reducing damage to the display panel 200. A structure capable of reducing damage to the display panel 200 through the third plate 204 and/or the fourth plate 205 is described in detail below.

According to various embodiments, as illustrated in FIG. 4A, a protrusion part and a depression part may be formed at one end of the first plate 202 and one end of the second plate 203, respectively. A first protrusion part 202-1 may be formed in the first plate 202. The first protrusion part 202-1 may refer, for example, to a portion protruding in an −X direction on the basis of FIG. 4A at one end of the first plate 202. In an embodiment, the first protrusion part 202-1 may refer, for example, to a portion protruding in the −X direction on the basis of FIG. 4A with respect to a second depression part 202-2 formed at one end of the first plate 202 to be described later.

According to various embodiments, a first depression part 203-1 may be formed in the second plate 203 in a way to correspond to the first protrusion part 202-1. The first depression part 203-1 may refer, for example, to a portion depressed in the −X direction on the basis of FIG. 4A at one end of the second plate 203. In an embodiment, the first depression part 203-1 may refer, for example, to a portion depressed in the −X direction on the basis of FIG. 4A with respect to a second protrusion part 203-2 formed at one end of the second plate 203 to be described later.

In an embodiment, the first protrusion part 202-1 and the first depression part 203-1 may form a given interval so that they do not come into contact with each other. For example, the first protrusion part 202-1 and the first depression part 203-1 may be spaced apart from each other at the first interval L1 in FIG. 4D.

According to various embodiments, the second depression part 202-2 may be formed in the first plate 202. The second depression part 202-2 may refer, for example, to a portion depressed in a +X direction on the basis of FIG. 4A at one end of the first plate 202. In an embodiment, the second depression part 202-2 may refer, for example, to a portion depressed in the +X direction on the basis of FIG. 4A with respect to the first protrusion part 202-1 of the first plate 202.

According to various embodiments, the second protrusion part 203-2 may be formed in the second plate 203 in a way to correspond to the second depression part 202-2. The second protrusion part 203-2 may refer, for example, to a portion protruding in the +X direction on the basis of FIG. 4A at one end of the second plate 203. In an embodiment, the second protrusion part 203-2 may refer, for example, to a portion protruding in the +X direction on the basis of FIG. 4A with respect to the first depression part 203-1 of the second plate 203.

In an embodiment, the second protrusion part 203-2 and the second depression part 202-2 may form a given interval so that they do not come into contact with each other. For example, the second protrusion part 203-2 and the second depression part 202-2 may be spaced apart from each other at the first interval L1 in FIG. 4D.

According to various embodiments, as illustrated in FIG. 4B, a protrusion part and a depression part may be formed at one end of the third plate 204 and one end of the fourth plate 205, respectively. A third protrusion part 204-1 may be formed in the third plate 204. The third protrusion part 204-1 may refer, for example, to a portion protruding in a −X direction on the basis of FIG. 4B at one end of the third plate 204. In an embodiment, the third protrusion part 204-1 may refer, for example, to a portion protruding in the −X direction on the basis of FIG. 4B with respect to a fourth depression part 204-2 formed at one end of the third plate 204 to be described later.

According to various embodiments, a third depression part 205-1 may be formed in the fourth plate 205 in a way to correspond to the third protrusion part 204-1. The third depression part 205-1 may refer, for example, to a portion depressed in the −X direction on the basis of FIG. 4B at one end of the fourth plate 205. In an embodiment, the third depression part 205-1 may refer, for example, to a portion depressed in the −X direction on the basis of FIG. 4B with respect to a fourth protrusion part 205-2 formed at one end of the fourth plate 205 to be described later.

In an embodiment, the third protrusion part 204-1 and the third depression part 205-1 may form a given interval so that they do not come into contact with each other. For example, the third protrusion part 204-1 and the third depression part 205-1 may be spaced apart from each other at a second interval L2 in FIG. 4D.

According to various embodiments, the fourth depression part 204-2 may be formed in the third plate 204. The fourth depression part 204-2 may refer, for example, to a portion depressed in a +X direction on the basis of FIG. 4B at one end of the third plate 204. In an embodiment, the fourth depression part 204-2 may refer, for example, to a portion depressed in the +X direction on the basis of FIG. 4B with respect to the third protrusion part 204-1 of the third plate 204.

According to various embodiments, the fourth protrusion part 205-2 may be formed in the fourth plate 205 in a way to correspond to the fourth depression part 204-2. The fourth protrusion part 205-2 may refer, for example, to a portion protruding in the +X direction on the basis of FIG. 4B at one end of the fourth plate 205. In an embodiment, the fourth protrusion part 205-2 may refer, for example, to a portion protruding in the +X direction on the basis of FIG. 4B with respect to the third depression part 205-1 of the fourth plate 205.

In an embodiment, the fourth protrusion part 205-2 and the fourth depression part 204-2 may form a given interval so that they do not come into contact with each other. For example, the fourth protrusion part 205-2 and the fourth depression part 204-2 may be spaced apart from each other at the second interval L2 in FIG. 4D.

According to various embodiments, as illustrated in FIG. 4C, at least one of the third protrusion part 204-1 of the third plate 204, the third depression part 205-1 of the fourth plate 205, the fourth depression part 204-2 of the third plate 204, and the fourth protrusion part 205-2 of the fourth plate 205 may be disposed in the −Z direction on the basis of FIG. 4D between the first protrusion part 202-1 of the first plate 202 and the first depression part 203-1 of the second plate 203. According to an embodiment, the third protrusion part 204-1 of the third plate 204 and/or the third depression part 205-1 of the fourth plate 205 may be disposed between the first protrusion part 202-1 and the first depression part 203-1. In an embodiment, the fourth depression part 204-2 of the third plate 204 and/or the fourth protrusion part 205-2 of the fourth plate 205 may be disposed between the first protrusion part 202-1 and the first depression part 203-1. Accordingly, when an external force is applied to the folding area 200-3 of the display panel 200, an area that belongs to the folding area 200-3 of the display panel 200 and that corresponds to an area between the first protrusion part 202-1 and the first depression part 203-1 may be supported by at least one of the third protrusion part 204-1 of the third plate 204, the third depression part 205-1 of the fourth plate 205, the fourth depression part 204-2 of the third plate 204, and the fourth protrusion part 205-2 of the fourth plate 205.

According to various embodiments, at least one of the third protrusion part 204-1 of the third plate 204, the third depression part 205-1 of the fourth plate 205, the fourth depression part 204-2 of the third plate 204, and the fourth protrusion part 205-2 of the fourth plate 205 may be disposed in the −Z direction on the basis of FIG. 4D between the second protrusion part 203-2 of the second plate 203 and the second depression part 202-2 of the first plate 202. According to an embodiment, the third protrusion part 204-1 of the third plate 204 and/or the third depression part 205-1 of the fourth plate 205 may be disposed between the second protrusion part 203-2 and the second depression part 202-2. In an embodiment, the fourth depression part 204-2 of the third plate 204 and/or the fourth protrusion part 205-2 of the fourth plate 205 may be disposed between the second protrusion part 203-2 and the second depression part 202-2. Accordingly, when an external force is applied to the folding area 200-3 of the display panel 200, an area that belongs to the folding area 200-3 of the display panel 200 and that corresponds to an area between the second protrusion part 203-2 and the second depression part 202-2 may be supported by at least one of the third protrusion part 204-1 of the third plate 204, the third depression part 205-1 of the fourth plate 205, the fourth depression part 204-2 of the third plate 204, and the fourth protrusion part 205-2 of the fourth plate 205.

According to various embodiments, as illustrated in FIGS. 4D and 4E, one end of the first plate 202 and one end of the second plate 203 may form a first interval L1. The first interval L1 may refer, for example, to a distance in an X axis direction on the basis of FIG. 4D. The first interval L1 may refer, for example, to a distance between the first protrusion part 202-1 of the first plate 202 and the first depression part 203-1 of the second plate 203 and a distance between the second depression part 202-2 of the first plate 202 and the second protrusion part 203-2 of the second plate 203. In an embodiment, the first interval L1 may be constant. In an embodiment, the first interval L1 may not be constant. For example, the interval between the first protrusion part 202-1 and the first depression part 203-1 and the interval between the second protrusion part 203-2 and the second depression part 202-2 may be different from each other.

According to various embodiments, as illustrated in FIGS. 4D and 4E, one end of the third plate 204 and one end of the fourth plate 205 may form a second interval L2. The second interval L2 may refer, for example, to a distance in the X axis direction on the basis of FIG. 4D. The second interval L2 may refer, for example, to a distance between the third protrusion part 204-1 of the third plate 204 and the third depression part 205-1 of the fourth plate 205 and a distance between the fourth depression part 204-2 of the third plate 204 and the fourth protrusion part 205-2 of the fourth plate 205. In an embodiment, the second interval L2 may be constant. In an embodiment, the second interval L2 may not be constant. For example, the interval between the third protrusion part 204-1 and the third depression part 205-1 and the interval between the fourth protrusion part 205-2 and the fourth depression part 204-2 may be different from each other.

According to various embodiments, as illustrated in FIG. 4D, one end of the second plate 203 and one end of the third plate 204 may be spaced apart from each other at a third interval L3. The third interval L3 may refer, for example, to a distance in the X axis direction on the basis of FIG. 4D. In an embodiment, the third interval L3 may refer, for example, to a distance between the second protrusion part 203-2 of the second plate 203 and the third protrusion part 204-1 of the third plate 204. In an embodiment, the third interval L3 may refer, for example, to a distance between the second protrusion part 203-2 of the second plate 203 and the fourth depression part 204-2 of the third plate 204. The third interval L3 may be greater than 0. For example, the third interval L3 may be 0.1 mm or more. When the third interval L3 is greater than 0, this may refer, for example, to the one end of the third plate 204 being disposed to protrude in a −X direction on the basis of FIG. 4D with respect to the one end of the second plate 203. This may refer, for example, to the one end of the second plate 203 being disposed to protrude in a +X direction on the basis of FIG. 4D with respect to the one end of the third plate 204, and may have the same meaning as that the one end of the second plate 203 and the one end of the third plate 204 disposed in the central part of the electronic device 100 are overlapped when the plates 202, 203, 204, and 205 are viewed in the −Z direction on the basis of FIG. 4D. According to such a structure, the third plate 204 can support the one end of the second plate 203 disposed in the central part of the electronic device 100, thus preventing and/or reducing a phenomenon in which the one end of the second plate 203 droops in a −Z direction. According to an embodiment of the disclosure, an area that belongs to the folding area 200-3 of the display panel 200 and that corresponds to the first interval L1, that is, the interval between the first plate 202 and the second plate 203, may be supported by the third plate 204.

According to various embodiments, as illustrated in FIG. 4E, one end of the first plate 202 and one end of the fourth plate 205 may be spaced apart from each other at a third interval L3. The third interval L3 may refer, for example, to a distance in a X axis direction on the basis of FIG. 4E. In an embodiment, the third interval L3 may refer, for example, to a distance between the first protrusion part 202-1 of the first plate 202 and the fourth protrusion part 205-2 of the fourth plate 205. In an embodiment, the third interval L3 may refer, for example, to a distance between the first protrusion part 202-1 of the first plate 202 and the third depression part 205-1 of the fourth plate 205. The third interval L3 may be greater than 0. For example, the third interval L3 may be 0.1 mm or more. When the third interval L3 is greater than 0, this may refer, for example, to the one end of the fourth plate 205 being disposed to protrude in the +X direction on the basis of FIG. 4E with respect to the one end of the first plate 202. This may have the same meaning as that the one end of the first plate 202 is disposed to protrude in the −X direction on the basis of FIG. 4E with respect to the one end of the fourth plate 205, and may have the same meaning as that the one end of the first plate 202 and the one end of the fourth plate 205 disposed in the central part of the electronic device 100 are overlapped when the plates 202, 203, 204, and 205 are viewed in the −Z direction on the basis of FIG. 4E. According to such a structure, the fourth plate 205 can support the one end of the first plate 202 disposed in the central part of the electronic device 100, thus preventing and/or reducing a phenomenon in which the one end of the first plate 202 droops in a −Z direction. According to an embodiment of the disclosure, an area that belongs to the folding area 200-3 of the display panel 200 and that corresponds to the first interval L1, that is, an interval between the first plate 202 and the second plate 203, may be supported by the fourth plate 205.

According to various embodiments of the disclosure, the third plate 204 may be disposed in the −Z direction in FIG. 4D with respect to the first plate 202. The fourth plate 205 may be disposed in the −Z direction in FIG. 4D with respect to the second plate 203. At least a part of at least one of the third plate 204 and the fourth plate 205 may be disposed either between the first protrusion part 202-1 and the first depression part 203-1 or between the second protrusion part 203-2 and the second depression part 202-2. For example, at least one of the third protrusion part 204-1 and the fourth depression part 204-2 formed in the third plate 204, and the third depression part 205-1 and the fourth protrusion part 205-2 formed in the fourth plate 205 may be disposed between the first plate 202 and the second plate 203. Accordingly, when an external force is applied to the folding area 200-3 of the display panel 200, an area that belongs to the folding area 200-3 and that corresponds to the interval L1 between the first plate 202 and the second plate 203 can be supported by the third plate 204 and/or the fourth plate 205, thus reducing damage to the display panel 200.

All the aforementioned protrusion parts and depression parts may be relative concepts. For example, some of one ends of the plates 202, 203, 204, and 205 may be protrusion parts, but other portions thereof may be depression parts. In an embodiment, a part of one end of the third plate 204 may be a depression part with respect to the third protrusion part 204-1, but may correspond to a protrusion part with respect to the fourth depression part 204-2. In still an embodiment, a part of one end of the fourth plate 205 may be a depression part with respect to the fourth protrusion part 205-2, but may be a protrusion part with respect to the third depression part 205-1.

FIG. 5 is a cutaway cross-sectional view of the first plate, the second plate, the hinge part, and the hinge cover along line A-A in FIG. 4C according to various embodiments.

According to various embodiments, a rotation radius R of a first plate 202 (e.g., the plate 132 in FIG. 1C) to the fourth plate 205 may be increased as the protrusion part is formed in the first plate 202 to the fourth plate 205. In an embodiment, when the first plate 202 to the fourth plate 205 are rotated, interference may occur between the protrusion part formed in the first plate 202 to the fourth plate 205 and a hinge part 206 (e.g., the hinge 164 in FIG. 1C). Particularly, interference may occur between the protrusion part formed in the first plate 202 to the fourth plate 205 and the bearing body 210 of the hinge part 206. Various embodiments of the disclosure may disclose various embodiments capable of preventing and/or reducing interference between the first protrusion part 202-1 to the fourth protrusion part 205-2 and the bearing body 210 under the rotation radius R of the first plate 202 to the fourth plate 205. Such embodiments are described in greater detail below.

According to various embodiments, as illustrated in FIG. 5, an accommodation part 213 may be formed in the bearing body 210 of the hinge part 206. In an embodiment, the accommodation part 213 may refer, for example, to a space formed in the bearing body 210 in order to prevent and/or reduce interference between at least one of the first protrusion part 202-1 of the first plate 202 and the second protrusion part 203-2 of a second plate 203 (e.g., the plate 132 in FIG. 1C) and the bearing body 210, when a first housing 110 (e.g., the first housing 110 in FIG. 1A) and a second housing 120 (e.g., the second housing 120 in FIG. 1A) are rotated and moved through the hinge part 206. The accommodation part 213 may be formed to have a sufficient size to the extent that the first protrusion part 202-1 and the second protrusion part 203-2 are prevented and/or reduced from interfering with the bearing body 210 when the first plate 202 and the second plate 203 are rotated.

In an embodiment not illustrated in the drawings, the accommodation part 213 may refer, for example, to a space formed in the bearing body 210 in order to prevent and/or reduce interference between at least one of the third protrusion part 204-1 of the third plate 204 and the fourth protrusion part 205-2 of the fourth plate 205 and the bearing body 210, when the first housing 110 and the second housing 120 are rotated and moved through the hinge part 206. The accommodation part 213 may be formed to have a sufficient size to the extent that the third protrusion part 204-1 and the fourth protrusion part 205-2 are prevented and/or reduced from interfering with the bearing body 210 when the third plate 204 and the fourth plate 205 are rotated.

FIG. 6 is a cutaway cross-sectional view of the third plate, the fourth plate, the hinge part, and the hinge cover along line B-B in FIG. 4C according to various embodiments.

According to various embodiments, a hinge part 206 (e.g., the hinge 164 in FIG. 1C) may be combined with a hinge cover 211 (e.g., the hinge cover 165 in FIG. 1B). For example, the fixing hole 217 including a screw may be formed in the fixing part 212 formed in the bearing body 210 of the hinge part 206 and the hinge cover 211. The hinge part 206 and the hinge cover 211 may be combined through the fixing member 214 passing through the fixing hole 217.

According to various embodiments, the rotation radius R of a first plate 202 (e.g., the plate 132 in FIG. 1C) to the fourth plate 205 may vary depending on an interval between the plates 202, 203, 204, and 205. The rotation radius R of the first plate 202 to the fourth plate 205 may be increased as the first interval L1, that is, an interval between the first plate 202 and a second plate 203 (e.g., the plate 132 in FIG. 1C), and/or the second interval L2, that is, an interval between the third plate 204 and the fourth plate 205, is reduced. When the first interval L1 and the second interval L2 are reduced, a portion that supports a folding area 200-3 (e.g., the folding area 131c in FIG. 1A) of a display panel 200 (e.g., the display 130 in FIG. 1A) may be increased. In an embodiment, the first interval L1 and/or the second interval L2 may be formed to have an interval of 0.5 mm or less.

According to various embodiments, as the first interval L1 and/or the second interval L2 are reduced, the rotation radius R may be increased. Accordingly, the first plate 202 to the fourth plate 205 may have interference with the fixing member 214 inserted into the fixing hole 217 of the fixing part 212 through the fixing hole 217 of the bearing body 210. An embodiment of the disclosure may provide a structure capable of preventing and/or reducing interference between the first plate 202 to the fourth plate 205 and the fixing member 214 under the rotation radius R of the first plate 202 to the fourth plate 205. Such an embodiment is described in detail below.

According to various embodiments, the fixing part 212 may be disposed in a +X direction or a −X direction on the basis of FIG. 6 with respect to a central axis (e.g., an M-M axis in FIG. 6) of the hinge cover 211. Accordingly, the first protrusion part 202-1 to the fourth protrusion part 205-2 can avoid interference with the fixing part 212 or the fixing member 214 inserted into the fixing hole 217 of the fixing part 212.

According to various embodiments, the fixing part 212 may be formed at a location of the hinge cover 211, which does not interfere with the first protrusion part 202-1 of the first plate 202 and the second protrusion part 203-2 of the second plate 203.

In an embodiment not illustrated in the drawings, the fixing part 212 may be isolated and formed in the +X direction on the basis of the M-M axis, that is, the central axis of the hinge cover 211 illustrated in FIG. 6, with respect to the second protrusion part 203-2 of the second plate 203. For example, the fixing part 212 may be isolated and formed at a fourth interval L4 in the +X direction in FIG. 6 on the basis of the M-M axis in FIG. 6 that passes through the center of the hinge cover 211. In this case, the fourth interval L4 may be, 0.8 mm or more.

In an embodiment not illustrated in the drawings, the fixing part 212 may be isolated and formed in a −X direction on the basis of the M-M axis in FIG. 6 with respect to the first protrusion part 202-1 of the first plate 202. For example, the fixing part 212 may be isolated and formed at the fourth interval L4 in the −X direction on the basis of the M-M axis in FIG. 6, which passes through the center of the hinge cover 211. In this case, the fourth interval L4 may be, for example, 0.8 mm or more.

According to an embodiment, the fixing part 212 may be isolated and formed in the same direction as a direction in which the first protrusion part 202-1 of the first plate 202 or the second protrusion part 203-2 of the second plate 203 protrudes. Accordingly, as the fixing part 212 is formed to be isolated from the first protrusion part 202-1 or the second protrusion part 203-2, when the first plate 202 and the second plate 203 are rotated, interference between the fixing part 212 and/or the fixing member 214 combined with the fixing part 212 and the first protrusion part 202-1 and/or the second protrusion part 203-2 may not occur.

According to various embodiments, the fixing part 212 may be formed at a location that does not interfere with the third protrusion part 204-1 of the third plate 204 and the fourth protrusion part 205-2 of the fourth plate 205.

With reference to FIG. 6, the fixing part 212 may be isolated and formed in the +X direction on the basis of the M-M axis, that is, the central axis of the hinge cover 211 illustrated in FIG. 6, with respect to the fourth protrusion part 205-2 of the fourth plate 205. The fixing part 212 may be isolated and formed at the fourth interval L4 in the +X direction on the basis of the M-M axis in FIG. 6, which passes through the center of the hinge cover 211. In this case, the fourth interval L4 may be, for example, 0.8 mm or more.

In an embodiment, the fixing part 212 may be isolated and formed in the −X direction on the basis of the M-M axis in FIG. 6, with respect to the third protrusion part 204-1 of the third plate 204. For example, the fixing part 212 may be isolated and formed at the fourth interval L4 in the −X direction on the basis of the M-M axis in FIG. 6, which passes through the center of the hinge cover 211. In this case, the fourth interval L4 may be, for example, 0.8 mm or more.

According to an embodiment, the fixing part 212 may be isolated and formed in the same direction as a direction in which the third protrusion part 204-1 of the third plate 204 or the fourth protrusion part 205-2 of the fourth plate 205 protrudes. Accordingly, as the fixing part 212 is formed to be isolated from the third protrusion part 204-1 or the fourth protrusion part 205-2, when the third plate 204 and the fourth plate 205 are rotated, interference between the fixing part 212 and/or the fixing member 214 combined with the fixing part 212 and the third protrusion part 204-1 and/or the fourth protrusion part 205-2 may not occur.

Furthermore, the aforementioned locations of the fixing part 212 are merely examples, and do not limit the location of the fixing part 212 as being fixed to the aforementioned locations. The location of the fixing part 212 may be variously changed within a range which may be practiced by those skilled in the art. For example, the location of the fixing part 212 may be formed in the central part of the hinge cover 211.

Figure 7A:
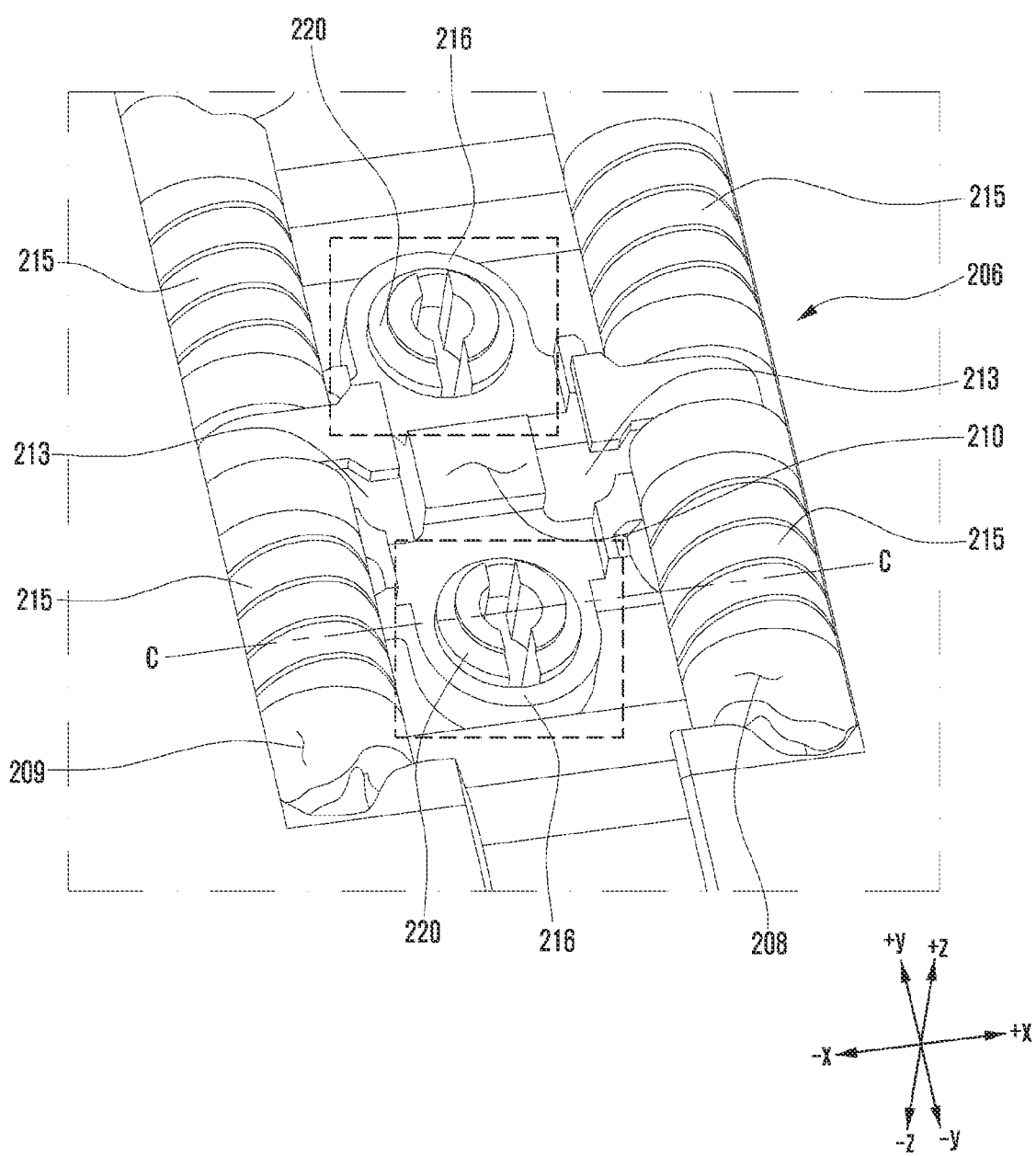
FIG. 7A is an enlarged view of a hinge according to various embodiments.

FIG. 7A is an enlarged perspective view of a hinge part according to various embodiments. FIG. 7B is a cutaway cross-sectional view illustrating an example hinge part and a hinge cover along line C-C in FIG. 7A according to various embodiments.

Hereinafter, the embodiments of FIGS. 7A and 7B are embodiments different from the aforementioned embodiments, and may have the same or similar construction as the aforementioned embodiments except a method of a hinge cover 211 (e.g., the hinge cover 165 in FIG. 1B) and a hinge part 206 (e.g., the hinge 164 in FIG. 1C) being combined.

According to various embodiments, as illustrated in FIGS. 7A and 7B, a hook 220 may be formed in the hinge cover 211. The hook 220 is fastened to a hook jaw 216 formed in the bearing body 210 of the hinge part 206, so the hinge cover 211 and the hinge part 206 may be fixed without being separated from each other.

According to various embodiments, the hook 220 may be formed at various locations on the hinge cover 211. In an embodiment, as illustrated in FIG. 7B, the hook 220 may be formed in the central part of the hinge cover 211. In an embodiment not illustrated, the hook 220 may be isolated and formed in a +X direction or −X direction on the basis of an M-M axis in FIG. 7B, that is, the central axis of the hinge cover.

An electronic device (e.g., the electronic device 100 in FIG. 1A) according to various example embodiments may include: a housing including a first housing (e.g., the first housing 110 in FIG. 1A) and a second housing (e.g., the second housing 120 in FIG. 1A), a hinge (e.g., the hinge 164 in FIG. 1C) connecting the first housing and the second housing to be rotatable, a display module including a display panel (e.g., the display 130 in FIG. 1A) including a first area (e.g., the first area 131a in FIG. 1A) disposed in the first housing, a second area (e.g., the second area 131b in FIG. 1A) disposed in the second housing, and a folding area (e.g., the folding area 131c in FIG. 1A) disposed at the hinge, a first plate (e.g., the plate 132 in FIG. 1C) supporting the first area of the display panel, and a second plate (e.g., the plate 132 in FIG. 1C) supporting the second area of the display panel, a third plate disposed under (e.g., the −Z direction on the basis of FIG. 2A) the first plate, and a fourth plate disposed under (e.g., the −Z direction on the basis of FIG. 2A) the second plate. At least a part of at least one of the third plate and the fourth plate may be disposed between the first plate and the second plate to support at least some of the folding area of the display panel.

Furthermore, the first plate may include a first protrusion part formed in a first direction (e.g., the −X direction on the basis of FIG. 4A) at one end of the first plate. The second plate may include the first depression part formed in the first direction corresponding to the first protrusion part at one end of the second plate facing the one end of the first plate. The first protrusion part and the first depression part may form a specified interval wherein the first protrusion part and the first depression part do not come into contact with each other.

Furthermore, the second plate includes the second protrusion part formed in a second direction (e.g., the +X direction on the basis of FIG. 4A), opposite to the first direction at one end of the second plate. The first plate includes the second depression part formed in the second direction corresponding to the second protrusion part at the one end of the first plate facing the one end of the second plate. The second protrusion part and the second depression part form a specified interval wherein the second protrusion part and the second depression part do not come into contact with each other.

Furthermore, the first plate may include the first protrusion part formed in a first direction (e.g., the −X direction on the basis of FIG. 4A) and the second depression part formed in a second direction (e.g., the +X direction on the basis of FIG. 4A), opposite to the first direction. The second plate may include the first depression part formed in the first direction corresponding to the first protrusion part and the second protrusion part formed in the second direction corresponding to the second depression part. At least a part of at least one of the third plate and the fourth plate may be disposed at at least one of places between the first protrusion part and the first depression part and between the second protrusion part and the second depression part.

Furthermore, the first plate may include a first protrusion part formed in a first direction at one end of the first plate. The first protrusion part may protrude in the first direction with respect to one end of the fourth plate.

Furthermore, the second plate may include a second protrusion part formed in a second direction, opposite to the first direction, at one end of the second plate. The second protrusion part may protrude in the second direction with respect to one end of the third plate.

Furthermore, the third plate may include a third protrusion part formed in the first direction at one end of the third plate. The fourth plate may include a third depression part formed in the first direction corresponding to the third protrusion part at one end of the fourth plate facing the one end of the third plate. The third protrusion part and the third depression part may form a specified interval wherein the third protrusion part and the third depression part do not come into contact with each other.

Furthermore, the fourth plate may include a fourth protrusion part formed in the second direction at one end of the fourth plate. The third plate may include a fourth depression part formed in the second direction corresponding to the fourth protrusion part at the one end of the third plate facing the one end of the fourth plate. The fourth protrusion part and the fourth depression part may form a specified interval wherein the fourth protrusion part and the fourth depression part do not come into contact with each other.

Furthermore, at least one of the third protrusion part, the third depression part, the fourth protrusion part, and the fourth depression part may be disposed between the first plate and the second plate.

Furthermore, at least one of the third protrusion part, the third depression part, the fourth protrusion part, and the fourth depression part may be disposed at at least one of places between the first protrusion part and the first depression part and between the second protrusion part and the second depression part.

Furthermore, the third plate may include a third protrusion part formed in a first direction at one end of the third plate. The third protrusion part may protrude in the first direction with respect to one end of the second plate and may be disposed between the first plate and the second plate.

Furthermore, the third plate may include a third protrusion part formed in the first direction at one end of the third plate. The third protrusion part may protrude in the first direction with respect to the one end of the first protrusion part or the one end of the second protrusion part and may be disposed between the first plate and the second plate.

Furthermore, the fourth plate may include a fourth protrusion part formed in a second direction opposite to the first direction at one end of the fourth plate. The fourth protrusion part may protrude in the second direction with respect to the one end of the first plate and may be disposed between the first plate and the second plate.

Furthermore, the fourth plate may include a fourth protrusion part formed in the second direction opposite to the first direction at one end of the fourth plate. The fourth protrusion part may protrude in the second direction with respect to one end of the first protrusion part or one end of the second protrusion part and may be disposed between the first plate and the second plate.

Furthermore, the electronic device may further include a hinge cover (e.g., the hinge cover 165 in FIG. 1B) having at least a part thereof forming an external appearance of the electronic device and combined with the hinge part.

Furthermore, the hinge may include an accommodation space configured to prevent and/or reduce interference with at least one of the first protrusion part and the second protrusion part based on the first housing and the second housing being rotated.

Furthermore, the hinge cover may include a fixing portion configured to receive a fastener passing through the hinge. The fixing portion may be isolated and formed in the first direction with respect to one end of the third protrusion part or isolated and formed in the second direction with respect to one end of the fourth protrusion part.

A hinge apparatus according to various example embodiments may include: a hinge (e.g., the hinge 164 in FIG. 1C) connecting a first housing (e.g., the first housing 110 in FIG. 1A) and a second housing (e.g., the second housing 120 in FIG. 1A) of an electronic device (e.g., the electronic device 100 in FIG. 1A) to be rotatable, a third plate disposed under (e.g., the −Z direction on the basis of FIG. 2A) a first plate (e.g., the plate 132 in FIG. 1C) supporting a first area (e.g., the first area 131*a* in FIG. 1A) of a display panel (e.g., the display 130 in FIG. 1A) of the electronic device and combined with the hinge, and a fourth plate disposed under (e.g., the −Z direction on the basis of FIG. 2A) a second plate (e.g., the plate 132 in FIG. 1C) supporting a second area (e.g., the second area 131*b* in FIG. 1A) of the display panel of the electronic device and combined with the hinge. At least a part of at least one of the third plate and the fourth plate may be disposed between the first plate and the second plate, and may support a folding area (e.g., the folding area 131*c* in FIG. 1A) of the display panel.

Furthermore, the third plate may include a first protrusion part (e.g., the third protrusion part 204-1 in FIG. 3B) formed in a first direction (e.g., the −X direction on the basis of FIG. 3B) at one end of the third plate. The fourth plate may include a first depression part (e.g., the third depression part 205-1 in FIG. 3B) formed in the first direction corresponding to the first protrusion part at one end of the fourth plate facing the one end of the third plate. The first protrusion part and the first depression part may form a specified interval wherein the first protrusion part and the first depression part do not come into contact with each other.

Furthermore, the fourth plate may include a second protrusion part (e.g., the fourth protrusion part 205-2 in FIG. 3B) formed in a second direction (e.g., the +X direction on the basis of FIG. 3B), opposite to the first direction at the one end of the fourth plate. The third plate may include a second depression part (e.g., the fourth depression part 204-2 in FIG. 3B) formed in the second direction corresponding to the second protrusion part at the one end of the third plate facing the one end of the fourth plate. The second protrusion part and the second depression part may form a specified interval wherein the second protrusion part and the second depression part do not come into contact with each other.

Furthermore, various example embodiments and drawings according to the disclosure have merely been presented as examples to describe technical contents according to the embodiments disclosed herein and to aid in understanding of the disclosure, but are not intended to limit the scope of the disclosure. Accordingly, as will be understood by those skilled in the art, various changes or modified forms may be made based on disclosure and should be understood as being included in the scope of the disclosure in addition to the embodiments disclosed herein. It will also be understood that any of the embodiment(s) described herein may be used in conjunction with any other embodiment(s) described herein.

What is claimed is:

1. An electronic device comprising:
    a housing comprising a first housing and a second housing;
    a hinge connecting the first housing and the second housing to be rotatable;
    a display module comprising a display panel comprising a first area disposed in the first housing, a second area disposed in the second housing, and a folding area disposed in the hinge, a first plate supporting the first area of the display panel, and a second plate supporting the second area of the display panel;
    a third plate disposed entirely under the first plate such that the first plate is at least partially disposed between the third plate and the display panel; and
    a fourth plate disposed entirely under the second plate such that the second plate is at least partially disposed between the fourth plate and the display panel,
    wherein at least a part of at least one of the third plate and the fourth plate is disposed between at least the first plate and the second plate to support at least some of the folding area of the display panel.

2. The electronic device of claim 1, wherein:
    the first plate comprises a first protrusion formed in a first direction at one end of the first plate,
    the second plate comprises a first recess formed in the first direction and corresponding to the first protrusion at one end of the second plate facing the one end of the first plate, and the first protrusion and the first recess form a specified interval wherein the first protrusion and the first recess do not come into contact with each other.

3. The electronic device of claim 2, wherein:
the second plate comprises a second protrusion formed in a second direction opposite to the first direction at the one end of the second plate,
the first plate comprises a second recess formed in the second direction and corresponding to the second protrusion at the one end of the first plate facing the one end of the second plate, and
the second protrusion and the second recess form a specified interval wherein the second protrusion and the second recess do not come into contact with each other.

4. The electronic device of claim 1, wherein:
the first plate comprises a first protrusion formed in a first direction and a second recess formed in a second direction opposite to the first direction,
the second plate comprises a first recess formed in the first direction and corresponding to the first protrusion and a second protrusion formed in the second direction and corresponding to the second recess, and
at least a part of at least one of the third plate and the fourth plate is disposed at at least one of places between the first protrusion and the first recess and between the second protrusion and the second recess.

5. The electronic device of claim 1, wherein:
the first plate comprises a first protrusion formed in a first direction at one end of the first plate, and
the first protrusion protrudes in the first direction with respect to one end of the fourth plate.

6. The electronic device of claim 2, wherein:
the second plate comprises a second protrusion formed in a second direction opposite to the first direction at one end of the second plate, and
the second protrusion protrudes in the second direction with respect to one end of the third plate.

7. The electronic device of claim 3, wherein:
the third plate comprises a third protrusion formed in the first direction at one end of the third plate,
the fourth plate comprises a third recess formed in the first direction in and corresponding to the third protrusion at one end of the fourth plate facing the one end of the third plate, and
the third protrusion and the third recess form a specified interval wherein the third protrusion and the third recess do not come into contact with each other.

8. The electronic device of claim 7, wherein:
the fourth plate comprises a fourth protrusion formed in the second direction at one end of the fourth plate,
the third plate comprises a fourth recess formed in the second direction and corresponding to the fourth protrusion at the one end of the third plate facing the one end of the fourth plate, and
the fourth protrusion and the fourth recess form a specified interval wherein the fourth protrusion and the fourth recess do not come into contact with each other.

9. The electronic device of claim 8, wherein at least one of the third protrusion, the third recess, the fourth protrusion, and the fourth recess is disposed between the first plate and the second plate.

10. The electronic device of claim 8, wherein at least one of the third protrusion, the third recess, the fourth protrusion, and the fourth recess is disposed at at least one of places between the first protrusion and the first recess and between the second protrusion and the second recess.

11. The electronic device of claim 1, wherein:
the third plate comprises a third protrusion formed in a first direction at one end of the third plate, and
the third protrusion protrudes in the first direction with respect to one end of the second plate and is disposed between the first plate and the second plate.

12. The electronic device of claim 3, wherein:
the third plate comprises a third protrusion formed in the first direction at one end of the third plate, and
the third protrusion protrudes in the first direction with respect to the one end of the first protrusion or the one end of the second protrusion and is disposed between the first plate and the second plate.

13. The electronic device of claim 11, wherein:
the fourth plate comprises a fourth protrusion formed in a second direction opposite to the first direction at one end of the fourth plate, and
the fourth protrusion protrudes in the second direction with respect to the one end of the first plate and is disposed between the first plate and the second plate.

14. The electronic device of claim 3, wherein:
the fourth plate comprises a fourth protrusion formed in the second direction opposite to the first direction at one end of the fourth plate, and
the fourth protrusion protrudes in the second direction with respect to one end of the first protrusion or one end of the second protrusion and is disposed between the first plate and the second plate.

15. The electronic device of claim 8, further comprising a hinge cover having at least a part thereof forming an external appearance of the electronic device and combined with the hinge.

16. The electronic device of claim 15, wherein the hinge comprises an accommodation space configured to reduce interference with at least one of the first protrusion and the second protrusion based on the first housing and the second housing being rotated.

17. The electronic device of claim 15, wherein:
the hinge cover comprises a fixing part configured to receive a fastener passing through the hinge, and
the fixing part is isolated and formed in the first direction with respect to one end of the third protrusion or isolated and formed in the second direction with respect to one end of the fourth protrusion.

18. A hinge apparatus comprising:
a hinge connecting at least a first housing and second housing of an electronic device to be rotatable relative to each other;
a third plate disposed entirely under at least a first plate supporting a first area of a display panel of the electronic device and combined with the hinge such that the display panel, the first plate, and the third plate are arranged in consecutive layers; and
a fourth plate disposed entirely under at least a second plate supporting a second area of the display panel of the electronic device and combined with the hinge such that the display panel, the second plate, and the fourth plate are arranged in consecutive layers,
wherein at least a part of at least one of the third plate and the fourth plate is disposed between the first plate and the second plate to support a folding area of the display panel.

19. The hinge apparatus of claim 18, wherein:

the third plate comprises a first protrusion formed in a first direction at one end of the third plate, the fourth plate comprises a first recess formed in the first direction and corresponding to the first protrusion at one end of the fourth plate facing the one end of the third plate, and the first protrusion and the first recess form a specified interval wherein the first protrusion and the first recess do not come into contact with each other.

20. The hinge apparatus of claim 19, wherein:

the fourth plate comprises a second protrusion formed in a second direction opposite to the first direction at the one end of the fourth plate, the third plate comprises a second recess formed in the second direction and corresponding to the second protrusion at the one end of the third plate facing the one end of the fourth plate, and the second protrusion and the second recess form a specified interval wherein the second protrusion and the second recess do not come into contact with each other.

* * * * *